United States Patent
Betz et al.

(10) Patent No.: US 9,773,208 B2
(45) Date of Patent: Sep. 26, 2017

(54) QUANTUM INFORMATION PROCESSING

(71) Applicant: HITACHI, LTD., Tokyo (JP)

(72) Inventors: Andreas Betz, Cambridgeshire (GB);
Miguel Fernando Gonzalez-Zalba, Cambridgeshire (GB)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/095,507

(22) Filed: Apr. 11, 2016

(65) Prior Publication Data
US 2016/0300155 A1 Oct. 13, 2016

(30) Foreign Application Priority Data
Apr. 12, 2015 (EP) .................... 15163298

(51) Int. Cl.
| | |
|---|---|
| H01L 29/06 | (2006.01) |
| G06N 99/00 | (2010.01) |
| H01L 39/02 | (2006.01) |
| B82Y 10/00 | (2011.01) |

(52) U.S. Cl.
CPC ............ *G06N 99/002* (2013.01); *B82Y 10/00* (2013.01); *H01L 39/025* (2013.01)

(58) Field of Classification Search
None
See application file for complete search history.

(56) References Cited

U.S. PATENT DOCUMENTS

| | | | |
|---|---|---|---|
| 2010/0182039 A1* | 7/2010 | Baumgardner | G06N 99/002 326/7 |
| 2012/0112168 A1 | 5/2012 | Bonderson et al. | |
| 2014/0262707 A1* | 9/2014 | Pawashe | H01H 59/0009 200/181 |
| 2015/0090958 A1* | 4/2015 | Yang | H01L 29/0676 257/27 |

FOREIGN PATENT DOCUMENTS

EP 1503328 A1 2/2005

OTHER PUBLICATIONS

J. Gorman et al., Charge-Qubit Operation of an Isolated Double Quantum Dot, Physical Review Letters, vol. 95, Aug. 26, 2005, pp. 090502-1-090502-4.
M. F. Gonzalez-Zalba et al., probing the limits of gate-based charge sensing, Nature Communications, vol. 6:6084, DOI: 10.1038, Jan. 20, 2015, pp. 1-8.

(Continued)

*Primary Examiner* — Calvin Choi
(74) *Attorney, Agent, or Firm* — Baker Botts L.L.P.

(57) ABSTRACT

Quantum information processing apparatus and methods are described. The apparatus comprises a device for defining a qubit and a reflectometry circuit for reading out a state of the qubit. The device comprises a semiconductor nanowire extending along a first direction having first and second obtuse or acute edges running along the first direction, gate dielectric overlying the first and second edges of the nanowire and a split gate running across a section of the nanowire in a second, transverse direction, the split gate (Continued)

comprising first and second gates overlying the first and second edges respectively. The reflectometry circuit comprises a resonator coupled to the first or second gate.

15 Claims, 23 Drawing Sheets

(56) References Cited

OTHER PUBLICATIONS

B. Voisin et al., Few-Electron Edge-State Quantum Dots in a Silicon Nanowire Field-Effect Transistor, Nano Letters, 2014, vol. 14, pp. 2094-2098.
D. Wallin et al., Detection of charge states in nanowire quantum dots using a quantum point contact, Applied Physics Letters AIP USA, vol. 90, No. 17, Apr. 23, 2007, pp. 172112/1-3.
B. Voisin et al., The Coupled Atom Transistor: a first realization with shallow donors implanted in a FDSOI silicon nanowire, 2013 43rd European Solid-State Device Research Conference (ESSDERC). Proceedings IEEE Piscataway, NJ, USA, 2013, pp. 147-150.
J. Baugh et al., Building a spin quantum bit register using semiconductor nanowires, Nanotechnology IOP Publishing Ltd. UK, vol. 21, No. 3, Apr. 2, 2010, pp. 1-6.
Extended European Search Report, dated Oct. 23, 2015, which issued during the prosecution of European Patent Application No. 15163298.1, which corresponds to the present application.

* cited by examiner

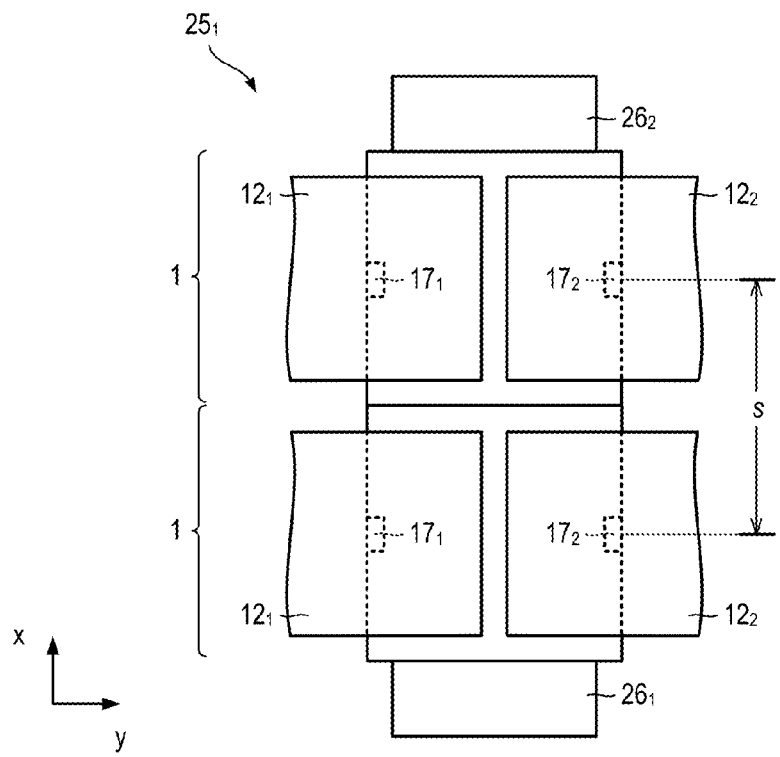
Fig. 18
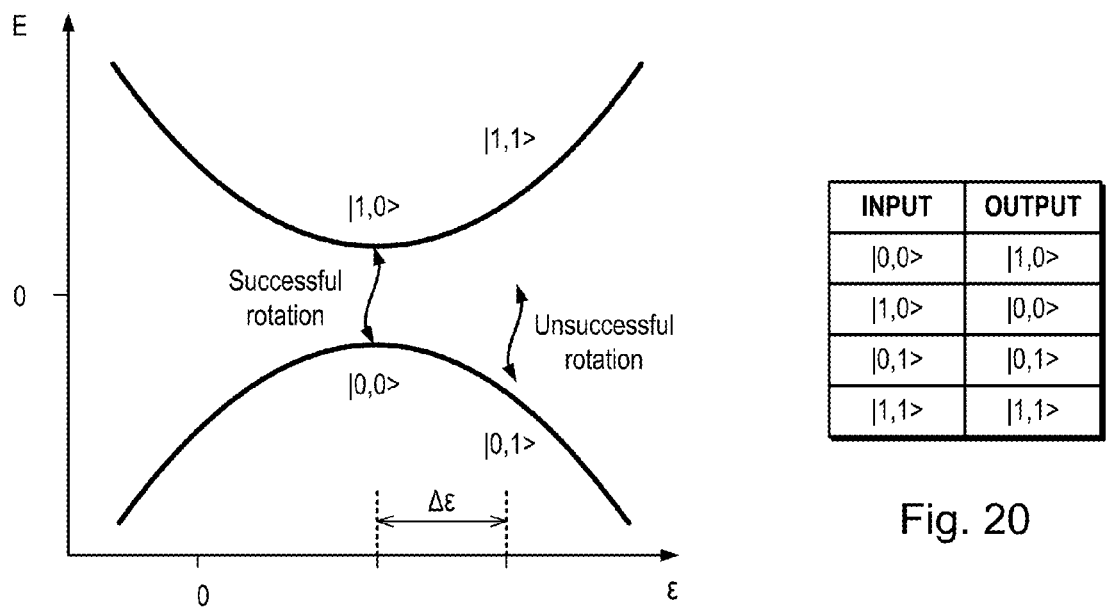
Fig. 19
Fig. 20

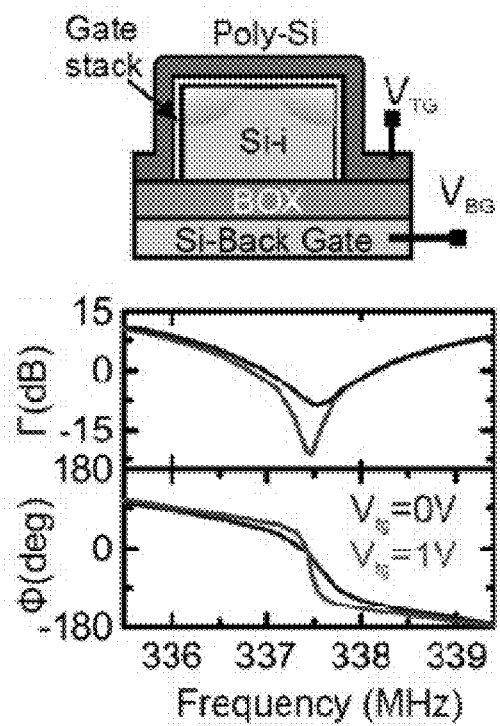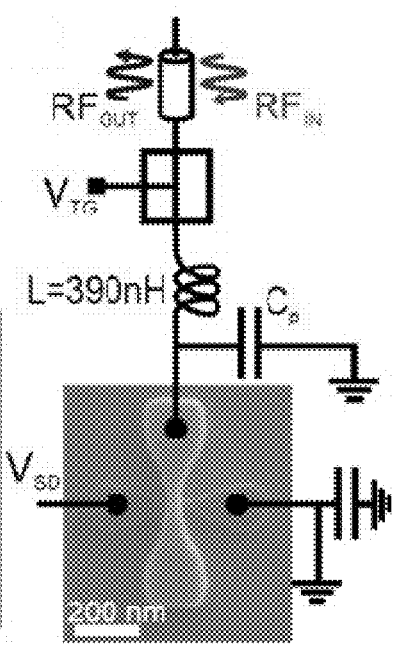
Fig. 26A
Fig. 26B
Fig. 26C

QUANTUM INFORMATION PROCESSING

CROSS REFERENCE TO PRIOR APPLICATIONS

This application claims benefit of priority to European Patent Application No. 15163298.1, the content of which is hereby incorporated by reference.

FIELD OF THE INVENTION

The present invention relates to quantum information processing.

BACKGROUND

Quantum information processing uses quantum mechanical effects to store and process information in the form of quantum bits or "qubits".

Different types of systems have been proposed which can implement a two-level system which can be used as a qubit, such as ion traps, dopant impurities, superconducting devices and quantum dots.

An isolated double quantum dot may be used to provide a charge qubit which can be initialised and manipulated using capacitively-coupled gates and using a capacitively coupled single-electron transistor, as described in J. Gorman et al: "Charge-Qubit Operation of an Isolated Double Quantum Dot", Physical Review Letters, volume 95, page 090502 (2005). Quantum dots can also be used to provide other types of qubits, such as spin qubits. Although quantum dot-based quantum information processing offers many advantages, current quantum dot-based systems tend to fall short of providing a practical system. For example, there tend to be limits as to how the number of qubits system can be scaled up while also allowing easy initialisation, manipulation and read out.

Silicon nanowire field-effect transistors are being investigated as a possible system for implement spin and charge qubits. For example, B. Voisin et al.: "Few-Electron Edge-State Quantum Dots in a Silicon Nanowire Field-Effect Transistor", Nanoletters, volume 14, page 2094 (2014) describes a silicon nanowire field-effect transistor which forms edge states which can be localised into quantum dots to provide spin qubits. M. F. Gonzalez-Zalba, S. Barrud, A. J. Ferguson and A. C. Betz: "Probing the limits of gate-based charge sensing", Nature Communications, volume 6, page 6084 (2015) describes a silicon nanowire field-effect transistor which forms a double quantum dot system and high-sensitivity gate-based detection change sensing system. However, in these devices, control over the quantum dots is restricted which can limit how a qubit is initialised, manipulated and read out.

SUMMARY

According to a first aspect of the present invention there is provided quantum information processing apparatus. The apparatus comprises a device for defining a qubit and a reflectometry circuit for reading out a state of the qubit. The device comprises a semiconductor nanowire extending along a first direction having first and second obtuse or acute edges running along the first direction, gate dielectric underlying or overlying the first and second edges of the nanowire and a split gate running across the nanowire in a second, transverse direction, the split gate comprising first and second gates underlying or overlying the first and second edges respectively. The reflectometry circuit comprises a resonator coupled to the first or second gate. The resonator has a resonant frequency which changes according to the impedance of the device.

Thus, the device provides two edge (or "corner") states which are formed at the edges of the nanowire which can be longitudinally constrained, for example using spacers, to form a double quantum dot. The double quantum dot can be used to define a charge qubit, a singlet-triplet qubit or spin qubit. The split gate can be used to provide a means of detuning and carry out initialisation, manipulation and read out of the qubit. The qubit can be readout with high sensitivity using one of the gates, without the need for any external charge sensors.

Each edge may be an edge between a side face and a top or bottom face of the nanowire. An internal angle between the side face and the top or bottom face may be about 90°. For example, the nanowire may have a generally rectangular transverse cross section. The edge may be rounded, i.e. having a value of curvature $\kappa = k/w$ where w is the width of the nanowire and $k \geq 4$.

The device may comprise first and second barriers spaced apart along the nanowire so as to constrain lengths of the edges. The barriers may be steps in the nanowire. The barriers may be spacers. The barriers may be regions of doping. The barriers may be implanted regions. The barriers may define a section of the nanowire.

The device may comprise first and second dopants arranged adjacently to the first and second edges respectively.

The device may comprise at least two split gates spaced along the nanowire along the first direction.

The semiconductor is preferably monocrystalline. The semiconductor is preferably silicon. The semiconductor could be germanium. The nanowire under the split gate (including the part of the nanowire under the gap between the gates) is preferably undoped.

In the case that the first and second edges are the top edges or bottom edges, the nanowire has a width, w, which may be between 10 and 100 nm. Preferably, the width, w, is between 30 and 80 nm and, more preferably, between 40 and 60 nm. The nanowire under the split gate (including the part of the nanowire under the gap between the gates) has a thickness, $t_1$, of which may be at least 5 nm. The thickness may be less than or equal to 100 nm. The thickness may be less than or equal to 20 nm. The thickness, $t_1$, may be between 10 and 15 nm. The nanowire either side of the split gate has a thickness, $t_2$, which may be at least 5 nm greater than the thickness, $t_1$, of the nanowire under the split gate, i.e. $t_2 - t_1 \geq 5$ nm.

In the case that the first and second edges are lateral edges, the dimensions for the width and thickness are interchanged.

The gate dielectric may comprise at least one layer of dielectric material. The at least one layer of dielectric material may comprise silicon dioxide. The at least one layer may comprise a high-k dielectric material. The gate dielectric has a thickness, $t_d$. The gate dielectric may comprise a layer of silicon dioxide and a layer of high-k dielectric material. The layer of silicon dioxide may have a thickness of at least 0.5 nm and the layer of high-k dielectric material may have a thickness of between 1 nm and 4 nm, for example, about 2 nm. The high-k dielectric material may be HfSiON. A gate dielectric/gate interlayer may be disposed between the gate dielectric and the split gate.

The interlayer may be TiN. The interlayer may have a thickness of between 2 and 10 nm. The gate dielectric may be split or may be a single pad.

The split gate preferably comprises polycrystalline silicon. The split gate may comprise a metal, e.g. aluminium or tungsten. The split gate may have a thickness of between 30 and 100 nm. Preferably, the split gate has a thickness of between 40 and 60 nm. The split gate may have a length, L, of between 20 and 100 nm. Preferably, the length, L, is between 40 and 60 nm. The split gates are separated by a gap, $s_{sg}$, which be v nm less than the width, w, of the nanowire, i.e. $s_{sg}$=w−v. v may be between 5 to 15 nm, and is preferably about 10 nm. $s_{sg}$ is preferably between 20 and 30 nm.

The device may comprise first and second spacer elements spaced apart along the nanowire, i.e. either side of the split gate. The spacer elements comprise a dielectric material. The dielectric material is preferably different to the gate dielectric. The dielectric material may be silicon nitride. Each spacer element may have a length, $l_s$, (i.e. along the nanowire) of between 5 and 20 nm. Each spacer element preferably has a length of between 10 and 15 nm.

The device may further comprise a conductive substrate and a dielectric layer disposed on the conductive substrate. The semiconductor nanowire may be supported on the dielectric layer. Thus, the conductive substrate may provide a back gate.

The device may further comprise a dielectric layer overlying the semiconductor nanowire and the split gate, and a conductive layer overlying the dielectric layer. Thus, the conductive layer may provide a top gate. The nanowire may include undoped region between an end of a gate and a start of doped contact region. Thus, the top gate can be used to selectively form an inversion layer in the undoped region.

The device may further comprise a ferromagnet disposed closer to first or second edge so as to generate a magnetic field gradient between the first and second edges.

The device may further comprise a dielectric layer overlying the (or each) split gate and a (respective) conductive bus line running along the second direction over the (or each) split gate.

The resonator may comprise an LC circuit comprising an inductor having first and second terminals, the first terminal of the inductor coupled to the first or second gate.

The reflectometry circuit may further comprise a radio frequency signal source arranged to provide an excitation signal to the resonator and a phase detector arranged to measure phase change in the resonator. The phase detector may be a demodulator.

The device may comprise first and second split gates spaced along the nanowire along the first direction and the reflectometry circuit may comprise first and second radio frequency signal sources, a combiner for combining feed signals from the first and second radio frequency signal sources, first and second phase detectors, a splitter for splitting a reflected signal and feeding the signal to the first and second phase detectors, first and second resonators, each resonator coupled to a one of the first and second gates of a one of the two split gates respectively and a coupler for allowing feed signals to be supplied to the first and second LC circuits and to receive reflected signals from the first and second LC circuits.

The apparatus may comprise first and second devices comprising first and second different nanowires and a common gate shared by the first and second devices, the common gate providing the first gate of the split gate of the first device and the second gate of the split gate of the second device. The first and second nanowires may be laterally or vertically spaced apart. The apparatus may comprise at least two nanowires, wherein each nanowire provides at least two devices.

The apparatus may comprise at least three nanowires, wherein each nanowire provides at least two devices. At least two nanowires may be laterally spaced apart and at least two nanowires may be vertically spaced apart.

The apparatus may further comprise a refrigerator configured to cool the device(s) to a temperature below 10 K, preferably to a temperature at or below 4.2 K and more preferably to a temperature at or below 200 mK.

According to a second aspect of the present invention there is provided a method of operating the apparatus.

The method may comprise forming first and second quantum dots in the device so as to form a qubit. Forming first and second quantum dots may comprise applying first and second biases to the first and second gates respectively. The method may comprise initialising the qubit in an initial state. The method may comprise performing at least one transformation on the initial state which results in a final state. The method may comprise reading out the final state using the reflectometry circuit.

Reading out the final state may comprise detuning the qubit to a minimum or maximum in energy band and then reading the final state. Detuning may comprise applying a voltage configuration to the first and second gates.

BRIEF DESCRIPTION OF THE DRAWINGS

Certain embodiments of the present invention will now be described, by way of example, with reference to the accompanying drawings, in which:

FIG. 18 is a plan view of a two-qubit charge-qubit device which can be used to a charge qubit a controlled NOT gate;

FIG. 19 is an energy diagram for the two-qubit charge-qubit device shown in FIG. 18 illustrating (i) when a control qubit is set to |0>, then a target qubit is successfully rotated and (ii) when a control qubit is set to |1> (following microwave control), then a target qubit is left in its initial state;

FIG. 20 is an input-output table for a controlled NOT gate;

FIG. 26A is a schematic side view of a device described in M. F. Gonzalez-Zalba, S. Barrud, A. J. Ferguson and A. C. Betz: Probing the limits of gate-based charge sensing, Nature Communications, volume 6, page 6084 (2015);

FIG. 26B shows the device shown in FIG. 26A embedded in a resonant tank circuit;

FIG. 26C shows reflectometry responses in magnitude (top) and phase (bottom) when the device shown in FIG. 26B is OFF ($V_{tg}$=0 V) and ON ($V_{tg}$=1 V);

DETAILED DESCRIPTION OF CERTAIN EMBODIMENTS

1 Well-Defined Qubits

1.1 Architecture

Figure 1:
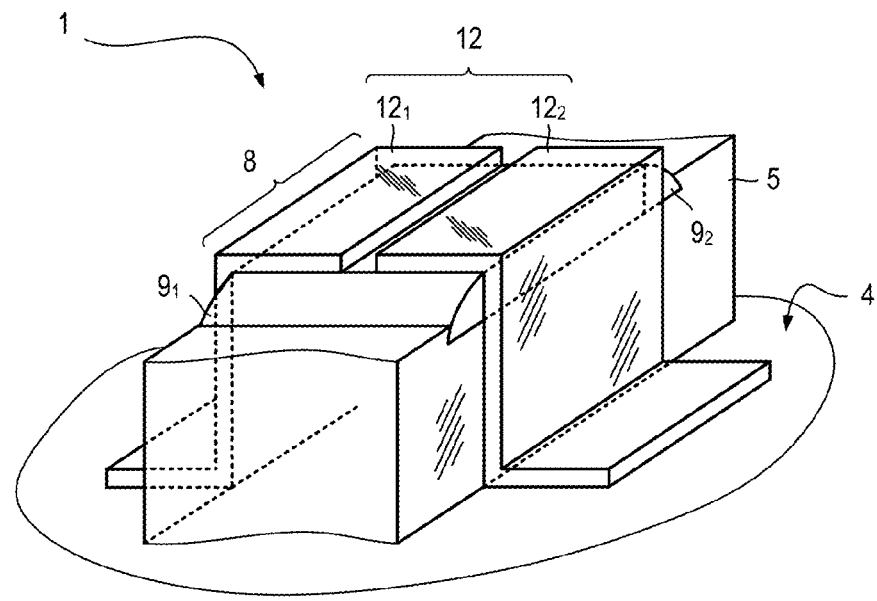
FIG. 1 is a schematic perspective view of a silicon nanowire field-effect transistor.
Figure 2:
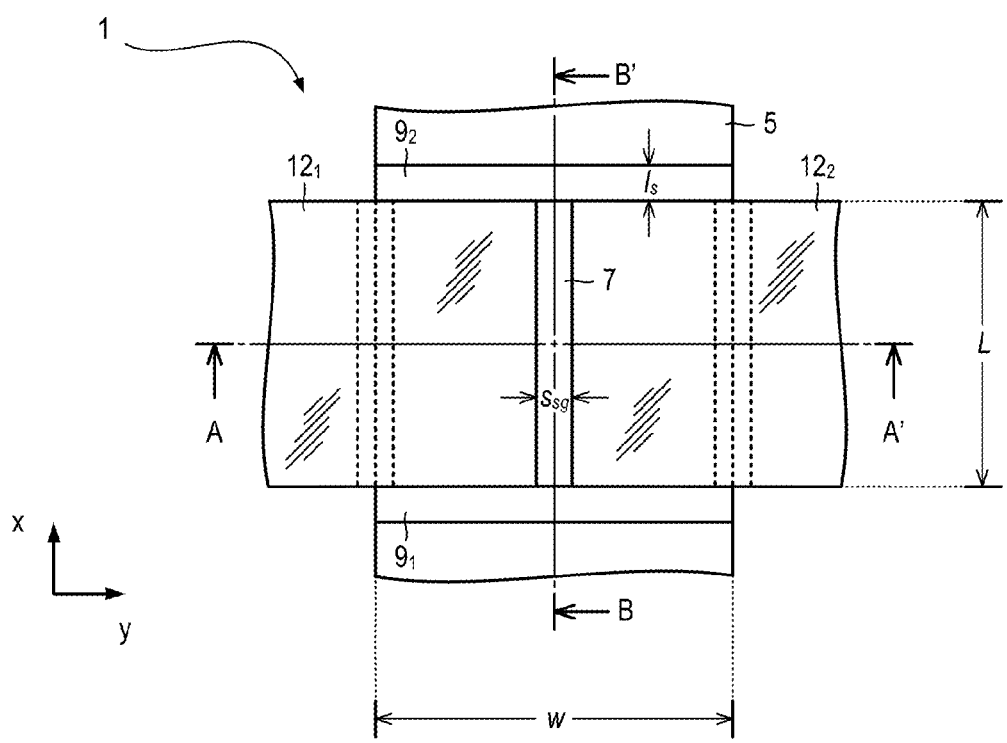
FIG. 2 is a plan view of the silicon nanowire field-effect transistor shown in FIG. 1.

Referring to FIG. 1 to FIG. 4, a silicon nanowire field-effect transistor 1 is shown.

The transistor 1 comprises a silicon substrate 2 and a silicon dioxide layer 3 having an upper surface 4 disposed on the substrate 2. An elongate conductive mesa 5 (or "channel") which is generally rectangular in cross section is disposed on the upper surface 4 of the dielectric layer 3 and runs in a first direction (along the x-axis). A gate dielectric 7 (best shown in FIG. 3) is disposed on a first section 8 of the mesa 4 between first and second silicon nitride spacer elements $9_1$, $9_2$ (which may also be referred to simply as "spacers"). The gate dielectric 7 comprises hafnium silicon oxynitride (HfSiON) or other high-k dielectric with an equivalent oxide thickness of less than 2 nm so as to provide strong gate-channel coupling. The gate dielectric 7 is formed on first and second faces $10_1$, $10_2$ and a top face 11 of the mesa 5. A split-gate arrangement 12 runs over the gate dielectric 7 in a second direction which is transverse to the orientation of the mesa 5. The split-gate arrangement 12 comprises first and second gate sections $12_1$, $12_2$ (hereinafter simply referred to as "top gate electrodes", "gate electrodes" or simply "gates"), each comprising titanium nitride (TiN) and heavily-doped polycrystalline silicon. Outside the first section 8 of the mesa 5 and the silicon nitride spacers $9_1$, $9_2$, epitaxial silicon layers $13_1$, $13_2$ are disposed on second and third sections $14_1$, $14_2$ of the mesa 5 and these sections are doped (by implantation and annealing) thereby providing contact regions $15_1$, $15_2$ to an undoped silicon channel 16. The spacer elements $9_1$, $9_2$ provide a steep doping gradient to the channel.

The undoped channel 16 has a width, w, of about 10 to 100 nm, preferably about 50 nm. The undoped channel 16 has a length, L, of between 20 and 100 nm, preferably about 50 nm. The spacers $9_1$, $9_2$ each have a length, $l_s$, of between 5 and 20 nm, preferably about 11 nm. The gates $12_1$, $12_2$ are separated by a gap, $s_{sg}$, which is v nm less than the width, w, of the nanowire, i.e. $s_{sg}$=w–v. v may be between 5 to 15 nm, and is preferably about 10 nm. $s_{sg}$ is preferably between 20 and 30 nm.

The silicon nanowire field-effect transistor 1 is fabricated using a silicon-on-insulator (SOI) substrate (not shown) with a buried oxide. The silicon layer is patterned to create the nanowires by means of optical or electron-beam lithography, followed by a resist trimming process. For the gate stack, a layer of HfSiON capped by a layer of TiN and a layer of polycrystalline silicon are deposited. After gate etching, which defines the split gate, a layer of silicon nitride is deposited and etched to form a spacer on the sidewalls of the gate. A layer of silicon is epitaxially grown before the source/drain extension implantation and activation annealing.

The nanowire field-effect transistor 1 is used to provide qubits using double quantum dots $17_1$, $17_2$ (best shown in FIG. 3) formed in corner states (not shown) of the transistor 1. Due to strong electric fields, first and second one-dimensional corner states (not shown) are formed along first and second upper edges $18_1$, $18_2$ of the mesa 5 between the first side face $10_1$ and the top face 11 and between the second side face $10_2$ and the top face 11 respectively. The spacer elements $9_1$, $9_2$ and remote charges (not shown) in the gate dielectric 7 constrict these one-dimensional corner states to zero-dimensional quantum dots $17_1$, $17_2$. One of the quantum dots $17_1$, $17_2$ can form a spin qubit or the double quantum dot $17_1$, $17_2$ forms charge or singlet-triplet qubit.

Coupling between the dots quantum dots $17_1$, $17_2$ can be controlled by a back-gate provided by the handle wafer, i.e. the silicon substrate 2. The first and second top gates $12_1$, $12_2$ provide independent control of electron occupancy in each quantum dot $17_1$, $17_2$.

Figure 5:
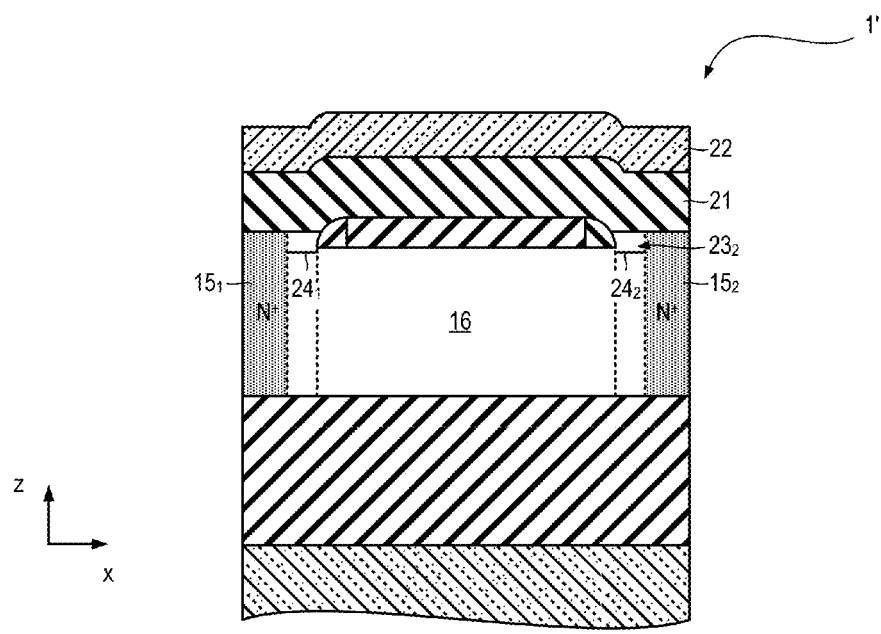
FIG. 5 is a cross-sectional view of a modified silicon nanowire field-effect transistor having modified contact doping profile and a global top gate structure.

Referring also to FIG. 5, a modified transistor 1' is shown.

In the modified transistor, doped contact regions $15_1$, $15_2$ are spaced away from the outer edges $20_1$, $20_2$ of the spacers $9_1$, $9_2$, for example, by several nanometers. The modified transistor 1' includes a global dielectric layer 21 overlying the mesa 5 and top gates $12_1$, $12_2$ and a global top gate electrode 22 disposed on the dielectric layer 20. The spacers $9_1$, $9_2$ can be omitted.

The global top gate 20 can be used to apply a global electric field to undoped regions $23_1$, $23_2$ between the contact regions $15_1$, $15_2$ and the silicon channel 16. When a positive bias having a sufficiently-large magnitude (i.e. exceeding a threshold bias) is applied to the global top gate 20, two-dimensional electron gas regions $24_1$, $24_2$ are formed in the undoped regions $23_1$, $23_2$. When no bias or a sub-threshold bias is applied, then no two-dimensional electron gas regions form and so the undoped channel region 16 under the gate is electrically isolated. This gate arrangement can help to improve device operation by reducing the amount of electrical noise introduced into the system during computation and readout.

Figure 6:
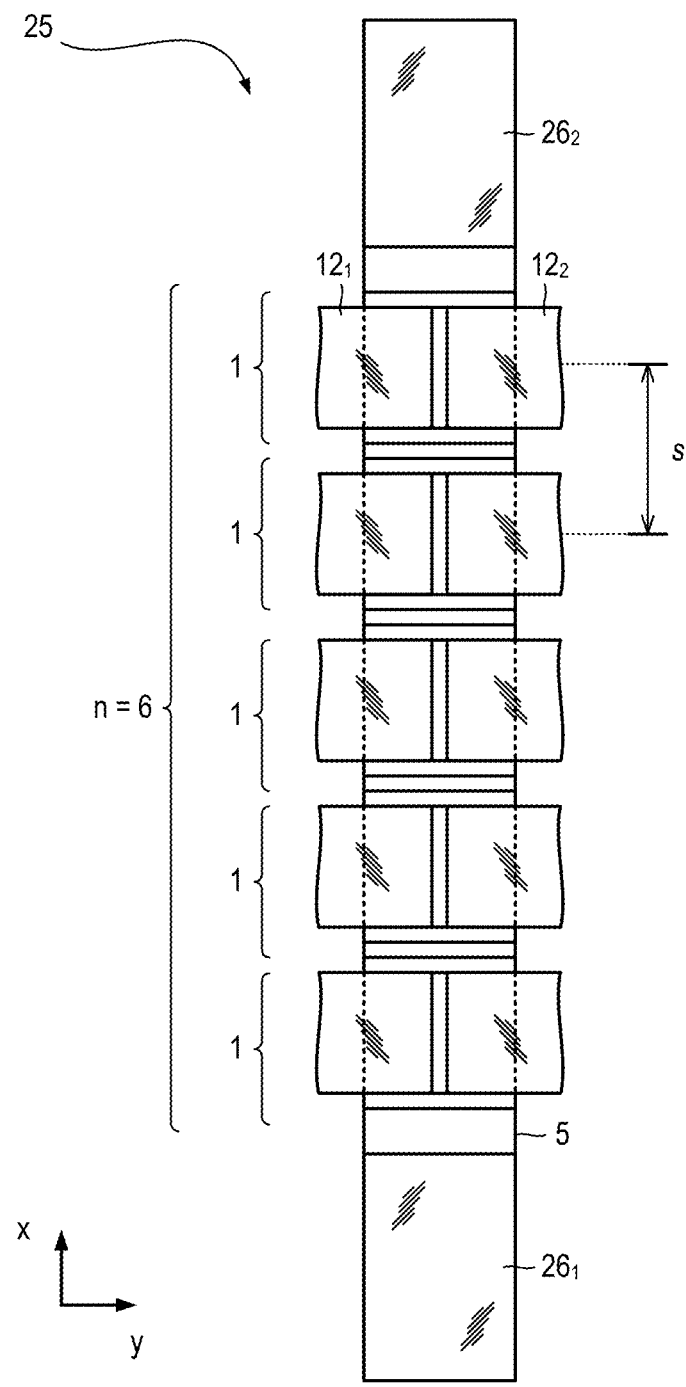
FIG. 6 a plan view of a multiple, two-qubit system comprising a one-dimensional array of silicon nanowire field-effect transistors.

Referring to FIG. 6, a transistor 1 (FIG. 1) can form a two-qubit unit which can be repeated to form a multiple, two-qubit system 25. An array of n-units 1 share a common mesa 5 arranged between contact regions $26_1$, $26_2$.

Pairs of double quantum dots are separated by a distance, s. The separation, s, may be u nm greater than the gate length, L, i.e. s=L+u, where u is between 20 to 30 nm or less. The separation, s, may be set to help maximise coupling between dots.

1.2 Qubit Definition

Figure 3:
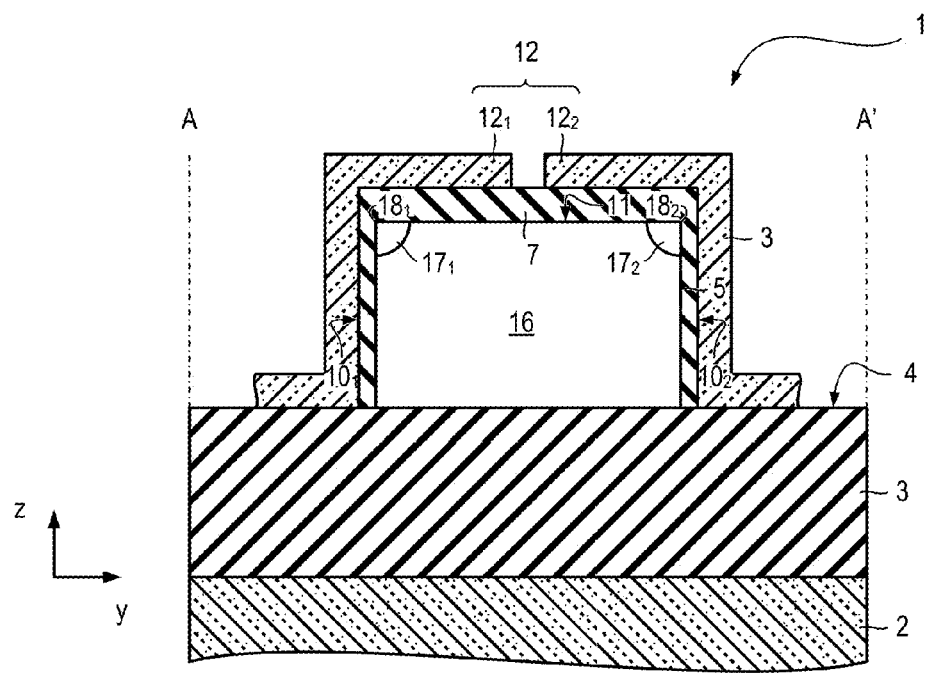
FIG. 3 is a cross-sectional view of the silicon nanowire field-effect transistor shown in FIG. 2 taken along the line A-A'.
Figure 4:
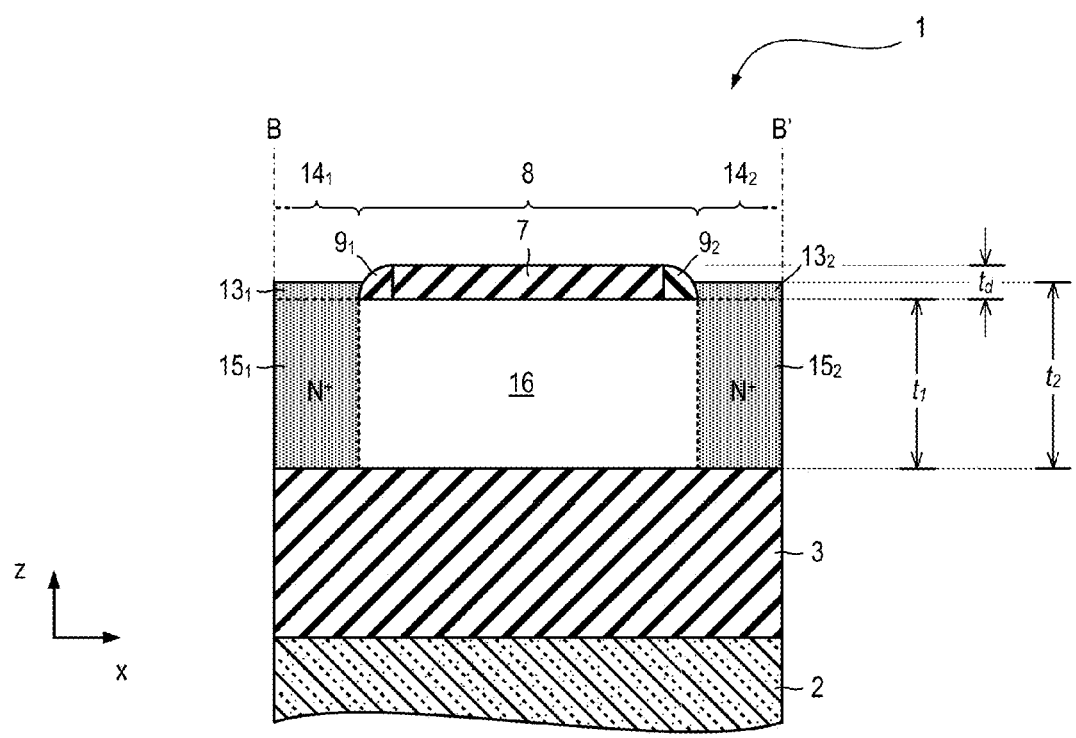
FIG. 4 is a cross-sectional view of the silicon nanowire field-effect transistor shown in FIG. 2 taken along the line B-B'.

Three types of qubits, each providing well-defined, two-level systems, can be implemented using the transistor 1 (FIG. 1), namely (i) a charge qubit, (2) a spin qubit and (iii) a singlet-triplet spin qubit. Each type of qubit makes use of two isolated electrons a double quantum dot system. The spin qubit is the most compact of three implementations as the qubit is defined in the spin degree of freedom of an electron in one quantum dot $17_1$, $17_2$ (FIG. 3). The charge qubit and the singlet-triplet qubit use two quantum dots $17_1$, $17_2$ (FIG. 3) to define the qubit.

1.2.1 Charge Qubit

Figure 7:
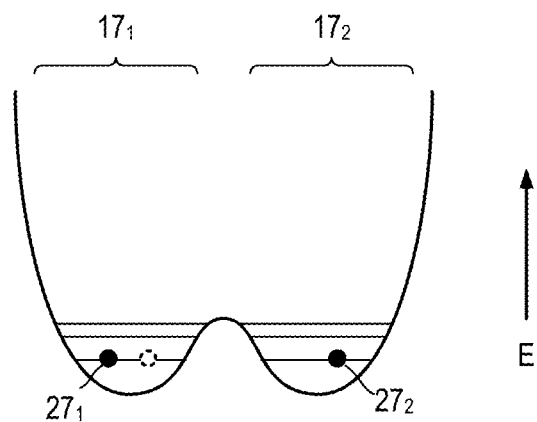
FIG. 7 illustrates first and second quantum dots populated by first and second electrons.

Referring to FIG. 7, an electron $27_1$, $27_2$ can be shared between the two quantum dots $17_1$, $17_2$ which are tunnel coupled. Using the quantum basis in which an electron $27_1$, $27_2$ is either on the left or the right dot, the Hamiltonian of the qubit can be defined as:

$$H = \frac{1}{2}\begin{pmatrix} \left(\varepsilon - \frac{\varepsilon_0}{2}\right) & 2t \\ -2t & -\left(\varepsilon - \frac{\varepsilon_0}{2}\right) \end{pmatrix} \quad (1)$$

where $\epsilon = e(V_{gl} - V_{gr})$ is detuning in which $V_{gl}$ and $V_{gr}$ are the biases applied to the first and second top gates $12_1$, $12_2$ and where $\epsilon_0 = 2e/C_g$ in which $C_g$ the gate capacitance and t is the tunnel coupling between the dots $17_1$, $17_2$. Detuning $\epsilon$ is proportional to the potential difference, i.e. $V_{gl} - V_{gr}$, between the split gates $12_1$, $12_2$.

Figure 8:
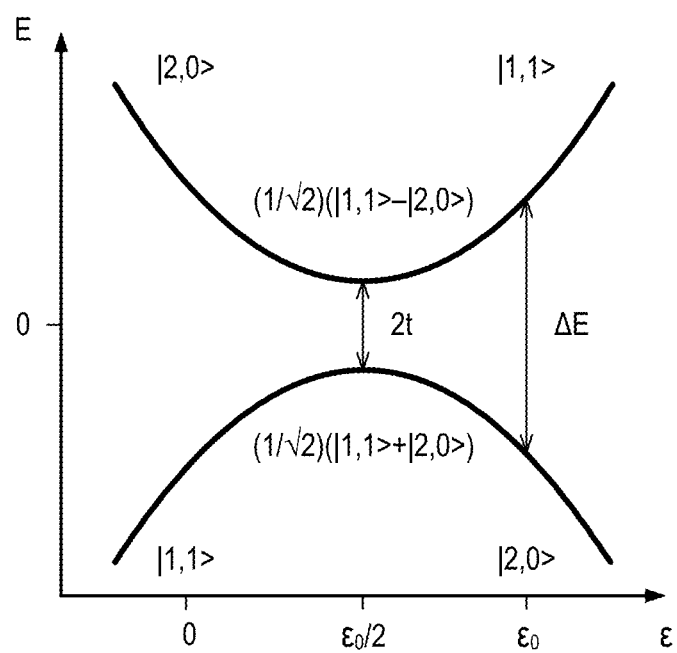
FIG. 8 is an energy diagram of a charge qubit as a function of detuning showing energy levels of the qubit split by twice the tunnel coupling t and qubit eigenstates for different detuning conditions.

Referring also to FIG. 8, ground state (−) and excited state (+) for the qubit are the eigenvalues of the Hamiltonian given in equation 1 above, namely:

$$E_\pm = \frac{1}{2}\sqrt{\left(\varepsilon - \frac{\varepsilon_0}{2}\right)^2 + 4t^2} \quad (2)$$

Depending on the value of detuning, $\epsilon$, two different sets of basis states can be defined for the charge qubit which are the eigenvectors of the Hamiltonian.

For $\epsilon=0$, two distinct levels can be defined by choosing the basis states $|1,1\rangle$ and $|2,0\rangle$, where $|1,1\rangle$ and $|2,0\rangle$ are the number of charges in the left and right dot $17_1$, $17_2$.

Alternatively, for $\epsilon=\epsilon_0/2$, bonding $1/\sqrt{2}(|1,1\rangle+|2,0\rangle)$ and anti-bonding $1/\sqrt{2}(|1,1\rangle-2,0\rangle)$ states of the double quantum dots dot $17_1$, $17_2$ can be used as a orthogonal basis of eigenstates.

1.2.2 Singlet-Triplet Qubit

A two-level system can be formed by a two-spin wavefunction of two separated electrons $27_1$, $27_2$ in state $|1,1\rangle$. The qubit basis is formed by the singlet $S=1/\sqrt{2}(|\uparrow,\downarrow\rangle-|\downarrow,\uparrow\rangle)$ and the triplet $T^0=1/\sqrt{2}(|\uparrow,\downarrow\rangle+|\downarrow,\uparrow\rangle)$ spin configuration. The other possible two electron spin wavefunctions $T^-=|\downarrow,\downarrow\rangle$ and $T^+=|\uparrow,\uparrow\rangle$ are split-off in energy by an externally applied magnetic field, B. The magnetic field, B, can lie in the between 10 and 100 mT.

Using the S-$T^0$ quantum basis, the qubit Hamiltonian can be defines as follows:

$$H = \begin{pmatrix} J(\varepsilon) & g\mu_B\Delta B_Z \\ g\mu_B\Delta B_Z & 0 \end{pmatrix} \quad (3)$$

where J is the detuning dependent spin exchange coupling and $\Delta B_Z$ is the difference in magnetic field along the direction of the externally-applied magnetic field.

Figure 9:
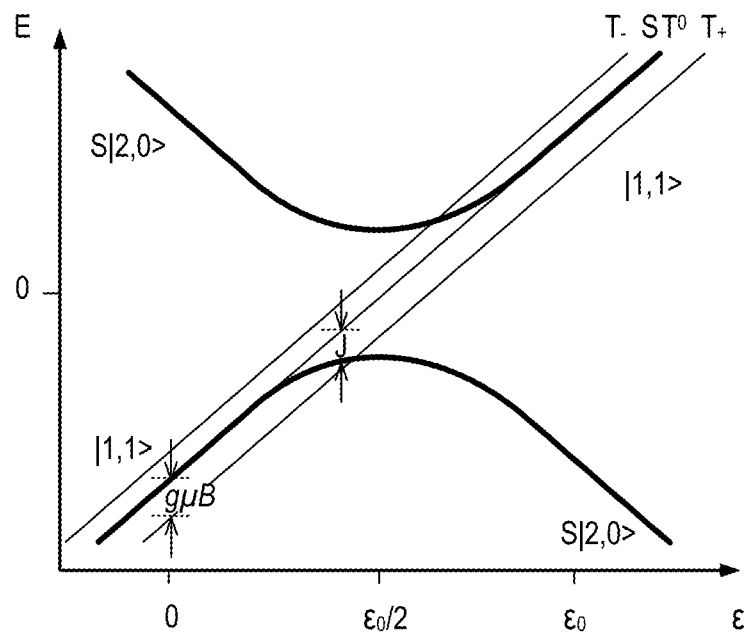
FIG. 9 is a diagram of a singlet-triplet qubit as a function of detuning showing qubit eigenstates and showing that $T^+$ and $T^-$ states are split from the S and $T^0$ states by an external magnetic field.

FIG. 9 shows the expected dependence of the exchange coupling J with detuning $\epsilon$. At $\epsilon=0$, J→0 and at $\epsilon=\epsilon_0/2$, J=t, i.e. half the tunnel coupling between the two dots $17_1$, $17_2$ of the qubit. Moreover at $\epsilon=\epsilon_0$, the ground state of the system is the $S|2,0\rangle$ where two electrons reside in the same dot and present a singlet configuration.

Figure 10:
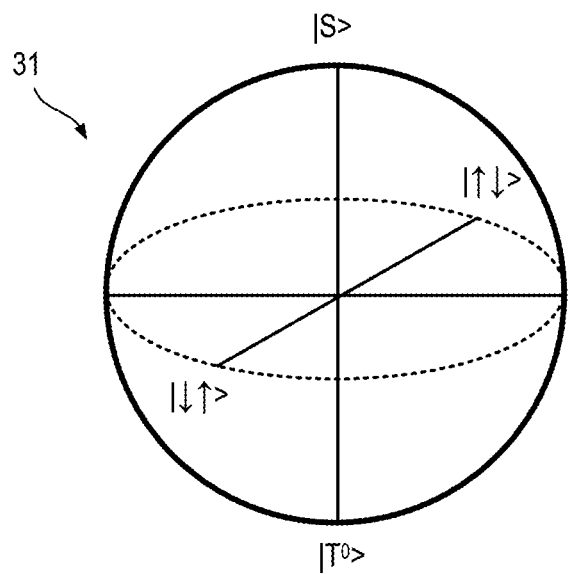
FIG. 10 shows the Bloch sphere for a singlet-triplet qubit.

FIG. 10 shows the Bloch sphere 31 for a singlet-triplet qubit.

The $\Delta B_Z$ term of the spin Hamiltonian can be generated in a number of different ways.

The difference in random hyperfine fields on each dot $17_1$, $17_2$ due to random location of naturally occurring $^{29}$Si atoms in silicon can be used. This is due to the non-zero nuclear spin of the this isotope $S(^{29}Si)=1/2$. These hyperfine fields present random time fluctuations with a Gaussian distribution of standard deviation $\Delta B_Z$=20 μT. Alternatively, an external micromagnet can be used.

Figure 11:
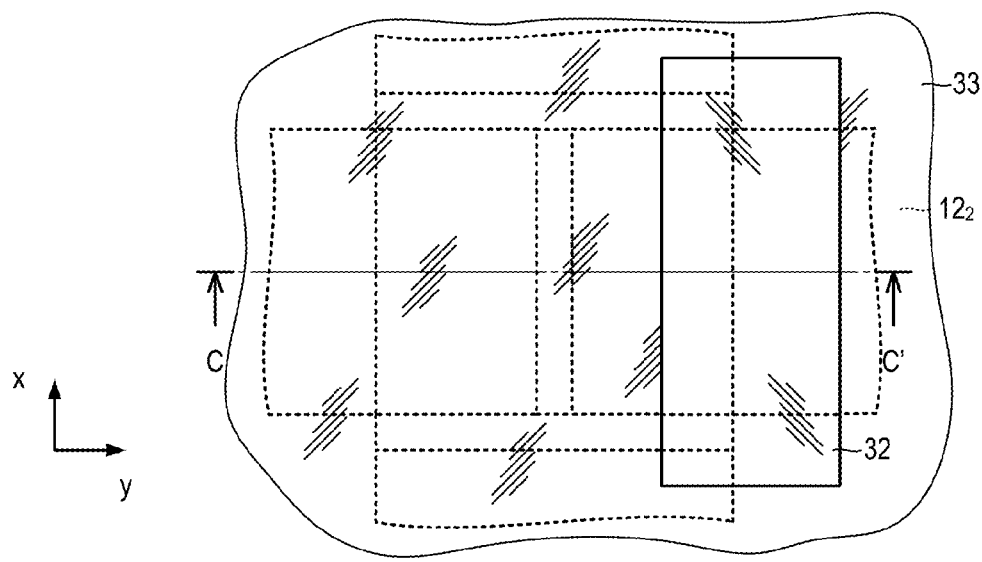
FIG. 11 is a plan view of a silicon nanowire field-effect transistor provided with a ferromagnet for implementing a singlet-triplet qubit.
Figure 12:
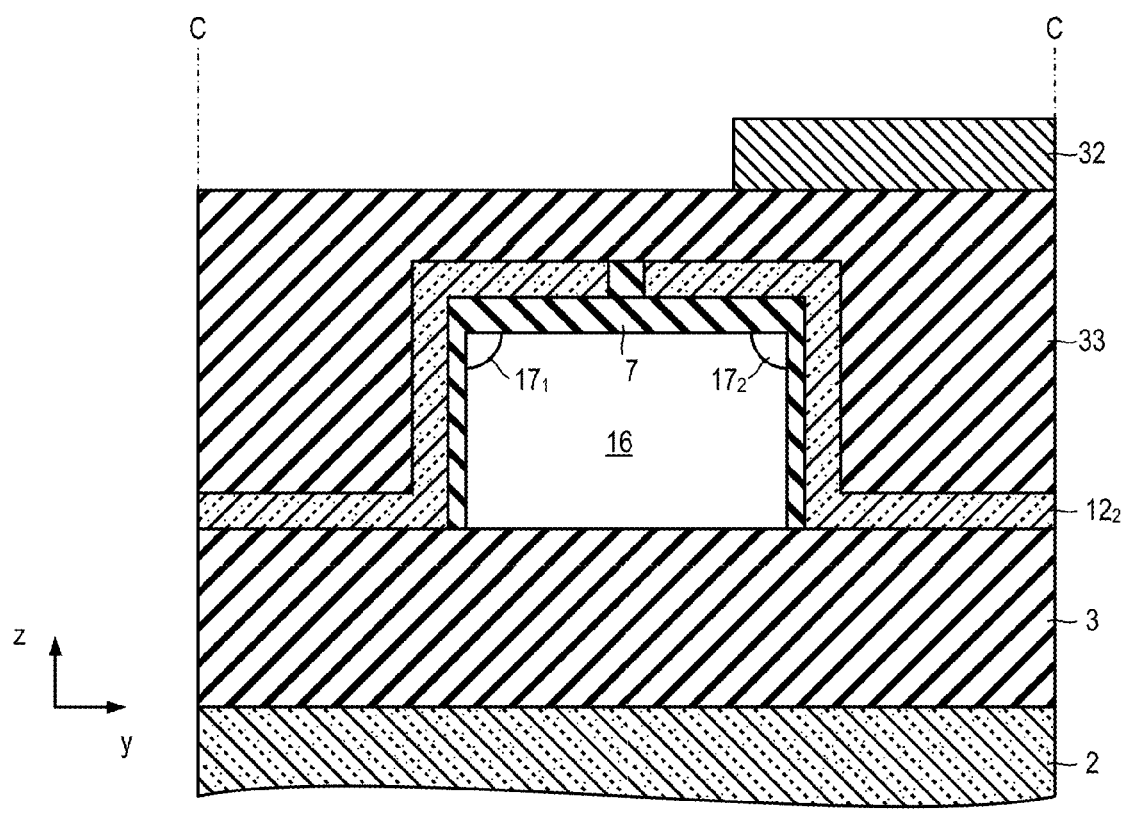
FIG. 12 is a cross-sectional view of the silicon nanowire field-effect transistor shown in FIG. 11 taken along the line C-C'.

Referring to FIG. 11 and FIG. 12, a magnetic field gradient across the double quantum dots $17_1$, $17_2$ can be achieved by using a ferromagnet 32 which is asymmetrically positioned, for example, by being disposed closer to one of the double quantum dots $17_1$, $17_2$.

The stray field produced by the micromagnet 32 varies linearly with the distance from the magnet 32 resulting in a different local magnetic field for each dot $17_1$, $17_2$. This effectively results in a $\Delta B_Z$ which is constant in time. The ferromagnet 32 may comprise, for example, cobalt, nickel or permalloy. The magnetization of the micromagnet 32 can be controlled by an external magnetic field leading to a magnetically-controlled $\Delta B_Z$.

Using a micromagnet 32, greater differences in magnetic field can be achieved, for example, up to $\Delta B_Z$=1 mT, thereby inducing faster rotations. A dielectric layer 33, for example in the form a layer of silicon dioxide having thickness of 10 to 20 nm, is used to separate the gate 12 from the micromagnet 32.

1.2.3 Spin Qubit

A two-level system can be formed by spin orientation of a single spin in one quantum dot $17_1$, $17_2$, namely spin down $|\downarrow\rangle$ and spin up $|\uparrow\rangle$. The qubit can be implemented in one quantum dot $17_1$, $17_2$ with one electron $27_1$, $27_2$ or one valence electron. This can provide a compact design as it allows for two qubits per transistor 1 (FIG. 1).

The Hamiltonian of the system is as follow:

$$H = \begin{pmatrix} 0 & 0 \\ 0 & g\mu_B B_0 \end{pmatrix} \quad (3)$$

where $g\mu_B B_0$ is the energy difference between the two spin states due to an applied external magnetic field.

To have a well-defined two level system, then the energy difference should be greater than the thermal energy, namely $g\mu_B B_0 > k_B T$, where $k_B$ is Bolzmann constant and T is temperature. Thus, at around 100 mK, the minimum magnetic field for operation is about $B_0^{min}$=0.1 T and at 4.2 K, the minimum magnetic field for operation is about $B_0^{min}$>3 T.

2 Long Coherence Times

The use of silicon as channel material can help to provide long coherence times for the different types of qubit hereinbefore described.

2.1 Charge Qubit

The main mechanism of decoherence for charge qubits is charge noise. A high-quality gate dielectric provides a high-quality Si—$SiO_2$ interface that can help to reduce electron phase decoherence arising from charge trapping at the interface. The device has a charge coherence times of the order of a few nanoseconds. As will be explained in more detail later, this is much longer than manipulation times thereby allowing several operations to be performed within the coherence time.

2.2 Singlet-Triplet Qubits

The main reason why silicon has long coherence times is that silicon is almost a nuclear spin-free environment. Silicon can be isotopically purified to further increase the coherence and reduce spin-orbit coupling. Spin coherence times of the order of milliseconds can be achieved.

2.3 Spin Qubit

Similar to singlet-triplet qubits, long coherence times can be achieved for electron spins in silicon, for example, up to 28 ms.

In all cases, the coherence times are much longer than the operation times, which is required for reliable control and quantum error correction protocols.

3 Initialisation to a Pure State 3.0 Introduction

Figure 13:
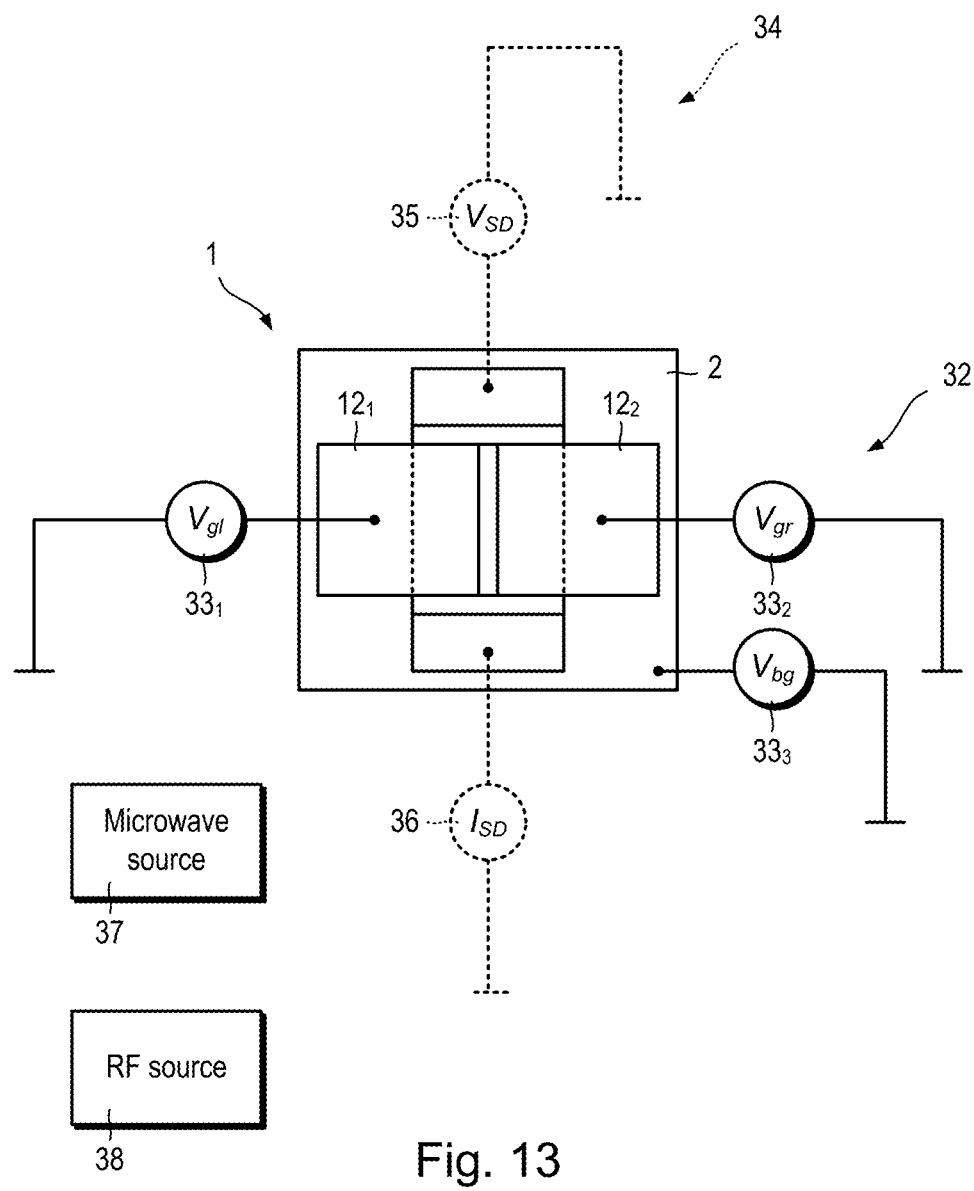
FIG. 13 illustrates a silicon nanowire field-effect transistor and circuitry for initialising a qubit.

Referring to FIG. 13, circuitry 32 for initialising qubits in a ground state will now be described. The circuitry 32 includes first and second voltage sources $33_1$, $33_2$ which are arranged to apply first and second biases $V_{gl}$, $V_{gr}$ to the first and second gates $12_1$, $12_2$ respectively and a third voltage source $33_3$ for applying a third bias $V_{bg}$ to the substrate 2.

Circuitry 34 for measuring source-drain characteristics may be provided which includes a third voltage source 35 and a current meter 36.

A microwave source 37 can be used to implement qubit transformations.

An rf source 38 can be used to implement qubit readout.

The voltage sources $33_1$, $33_2$ apply a predefined value $V_{gl} = V_{gr} = V_g^{init}$ such that a single excess electron $27_1$, $27_2$ resides in each quantum dot $17_1$, $17_2$, i.e. $|L,R\rangle = |1,1\rangle$.

Figure 14:
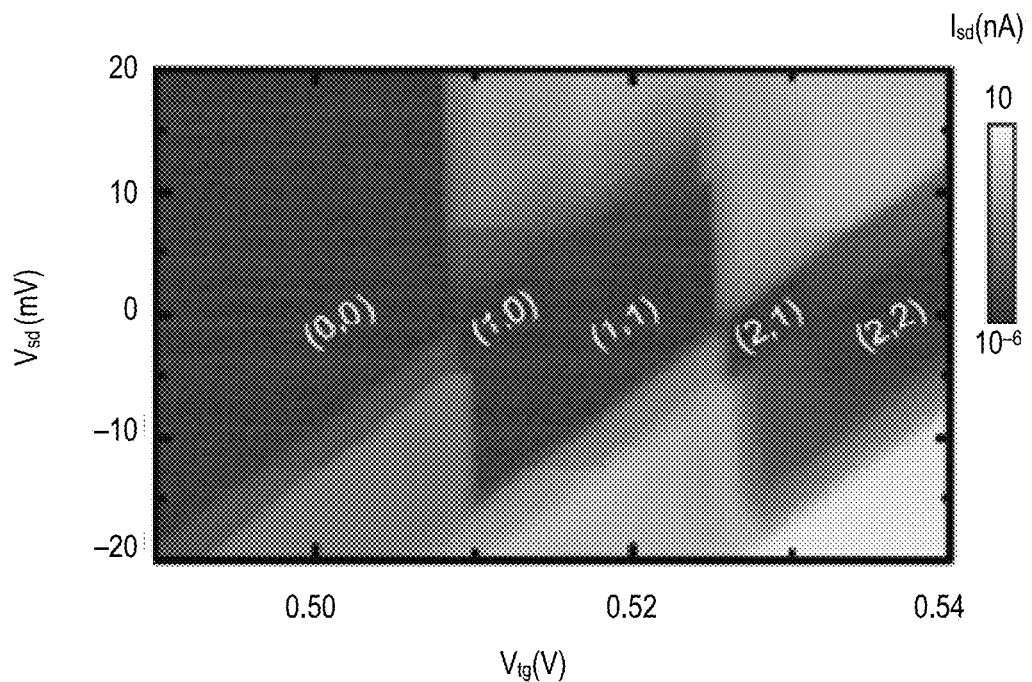
FIG. 14 is a plot of $V_{sd}$–$V_{tg}$ for determining a value of $V_{tg}$ need for initialisation, wherein $V_{tg}$ is chosen in a manner that provides the (1,1) state at $V_{sd}$=0V.

Referring to FIG. 14, this type of electron configuration can be seen in a measured $V_{sd}$-$V_{tg}$ stability diagram of a device which is similar to transistor 1, but which has a single gate, i.e. does not have a split-gate configuration, and which is described in M. F. Gonzalez-Zalba, S. Barrud, A. J. Ferguson and A. C. Betz: "Probing the limits of gate-based charge sensing", Nature Communications, volume 6, page (2015).

Figure 15:
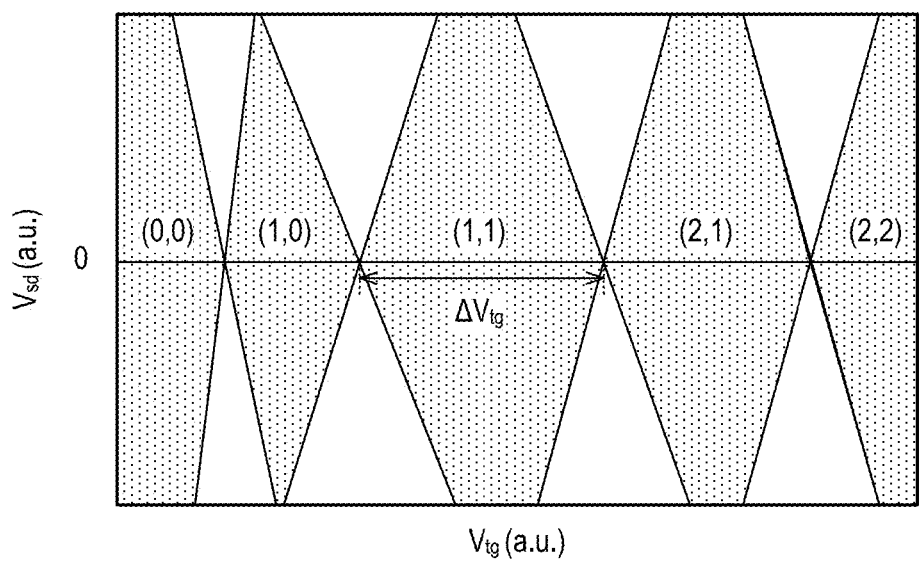
FIG. 15 is a schematic of $V_{sd}$–$V_{tg}$ highlighting the $V_{tg}$ tolerance $\Delta V_{tg}$.

Referring also to FIG. 15, symmetry of the transistor 1 can help to ensures that a single electron is loaded into each dot $17_1$, $17_2$ at very similar values of $V_{gl}$ and $V_{gr}$.

The next electronic transition (2,1) and (2,2) are separated in gate voltage space by $\Delta V_g \sim e/C_g$ where e is the charge of an electron and $C_g$ is the gate capacitance to one of the dots ($C_g$ and $C_{gr}$ can be expected to be similar). This flexibility in the initialization voltage offers tolerance with respect to device-to-device variability. A generous initialization tolerance $\Delta V_{gl} = \Delta V_{gr} \sim 10$ mV is expected. However, initialization tolerance can be increased by reducing the size of the quantum dots $17_1$, $17_2$, thereby increasing $C_g$ and $C_{gr}$.

A large tolerance in $V_{gl}$ and $V_{gr}$ also helps to implement quantum error correction.

3.1 Charge Qubit Initialisation

Referring to FIG. 3, FIG. 7 and FIG. 13, initialisation of a charge qubit will now be described.

If a barrier gate 22 (FIG. 5) is used, then applying a barrier gate bias, $V_{bar}$, exceeding a threshold (about 0.7 V) which allows charge transfer from an electron reservoir (i.e. source). If a barrier gate is not present, then this step can be omitted.

Biases, $V_{gl} = V_{gr} = V_g^{init}$, corresponding to $|1,1\rangle$ state are applied to the split top-gates $12_1$, $12_2$. This loads two electrons into the double quantum dots $17_1$, $17_2$. $V_{gl} = V_{gr} = V_g^{init} \sim 0.51$V. However, the value can be found by routine experiment, for example, by measuring source-drain current $I_{sd}$ as a function of source-drain voltage, $V_{sd}$, and first top gate voltage, $V_{gl}$, to obtain a $V_{sd}$-$V_{tg}$ stability diagram, similar to that shown in FIG. 14.

If a barrier gate 22 (FIG. 5) is used, then removing the barrier gate bias, $V_{bar}$, so as to electrically isolate the qubit (i.e. $V_{bar}$=0V).

If necessary, a bias, $V_{bg}$, is applied to the back gate, i.e. substrate 2, to adjust interdot coupling, t, so that the double quantum dot $17_1$, $17_2$ is in a molecular state. Typical values of t range between 1 to 20 GHz.

This initialises the system, i.e. qubit, to state |1,1>.

If the qubit needs to be initialised to a superposition state a |1,1>+b|2,0>, then biases are applied to the split gates $12_1$, $12_2$, to produce an appropriate potential difference between the split gates $12_1$, $12_2$ and so produce detuning between the quantum dots $17_1$, $17_2$.

Figure 16:
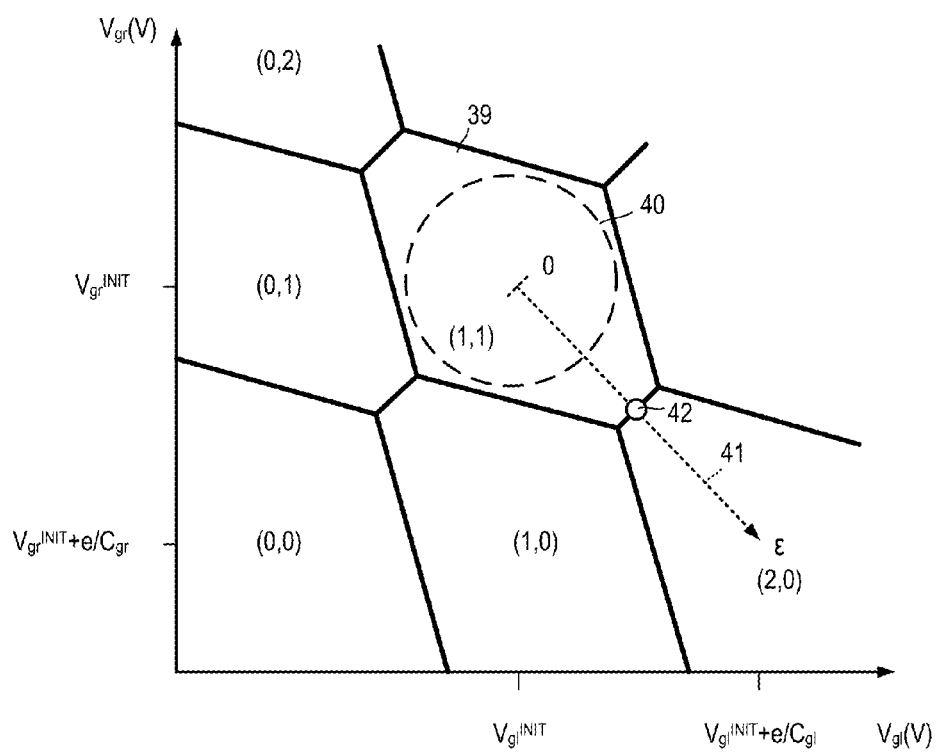
FIG. 16 is a $V_{gl}$–$V_{gr}$ charge stability diagram.

FIG. 16 illustrates a $V_{gl}$-$V_{gr}$ charge stability diagram. Hexagonal regions 39 mark areas in gate space $V_{gr}$, $V_{gl}$ where charge (n, m) is stable. The qubit is initialized in the (1,1) state by applying the same voltage $V_{gl}$=$V_{gr}$=$V_g^{init}$. The tolerance in $V_g$ is illustrated by a circle 40. A dotted arrow 41 indicates the detuning axis. The dot 42 indicates the point $\epsilon$=$\epsilon_0$/2, the bonding configuration.

Applying a voltage $(V_{gl}-V_{gr})$=$\epsilon_0$/2e, initialises the system in a bonding superposition of states.

3.2 ST Qubit Initialisation

Referring still to FIG. 3, FIG. 7 and FIG. 13, initialisation of a singlet-triplet qubit will now be described.

If a barrier gate 22 (FIG. 5) is used, then applying a barrier gate bias, $V_{bar}$, exceeding a threshold (about 0.7 V) which allows charge transfer from an electron reservoir (i.e. source). If a barrier gate is not present, then this step can be omitted.

Biases, $V_{gl}$=$V_g^{init}$+e/$C_g$ and $V_{gr}$=$V_g^{init}$-e/$C_g$, corresponding to |2,0> state are applied to the split top-gates $12_1$, $12_2$. This loads two electrons into one of the double quantum dots $17_1$, $17_2$.

If a barrier gate 22 (FIG. 5) is used, then removing the barrier gate bias, $V_{bar}$, so as to electrically isolate the qubit (i.e. $V_{bar}$=0V).

If necessary, a bias, $V_{bg}$, is applied to the back gate, i.e. substrate 2, to adjust interdot coupling, t, so that the double quantum dot $17_1$, $17_2$ is in a molecular state. Typical values of t range between 1 to 20 GHz. An external magnetic field B=10 to 100 mT is applied to split off the $T^-$=|↓,↓> and $T^+$=|↑,↑> spin states by the Zeeman energy. The gate voltages are ramped back to $V_{gl}$-$V_{gr}$=0 at a rate, f, which is slow compared to the tunnel coupling, i.e. f<t.

This initialises the system, i.e. qubit, in the state S(1,1) state 3.3 Spin Qubit Initialisation Referring still to FIG. 3, FIG. 7 and FIG. 13, initialisation of a spin qubit will now be described.

If a barrier gate 22 (FIG. 5) is used, then applying a barrier gate bias, $V_{bar}$, exceeding a threshold (about 0.7 V) which allows charge transfer from an electron reservoir (i.e. source). If a barrier gate is not present, then this step can be omitted.

Biases, $V_{gl}$=$V_g^{init}$ and $V_{gr}$=$V_g^{init}$-e/$C_g$, corresponding to |1,0> state are applied to the split top-gates $12_1$, $12_2$. This loads one electron into one of the double quantum dots $17_1$, $17_2$.

If a barrier gate 22 (FIG. 5) is used, then removing the barrier gate bias, $V_{bar}$, so as to electrically isolate the qubit (i.e. $V_{bar}$=0V).

If necessary, a bias, $V_{bg}$, is applied to the back gate, i.e. substrate 2, to adjust interdot coupling, t, so that the double quantum dot $17_1$, $17_2$ is in a molecular state. Typical values of t range between 1 to 20 GHz. An external magnetic field B=100 mT is applied to split (by the Zeeman effect), the |↓> and |↑> spin states.

The system is now in the |↓> state.

4 A Set of Universal Quantum Gates

Figure 17:
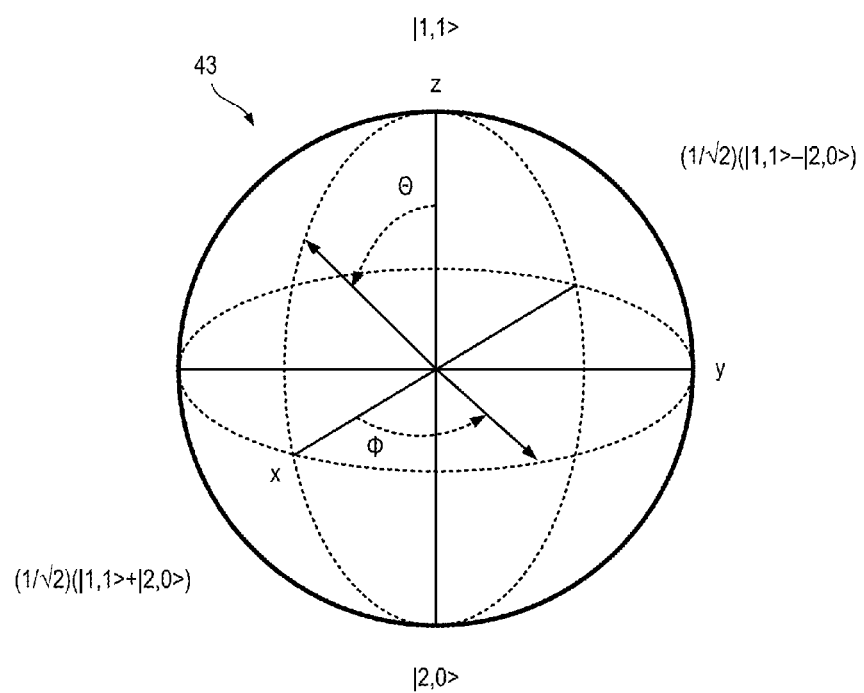
FIG. 17 illustrates a Bloch sphere and orientation of a qubit within the Bloch sphere in which the north and south poles are |1,1> and |2,0> states respectively and the ends of the x-axis (i.e. at $\Theta$=90° and $\Phi$=0° and 180°) are bonding and antibonding states $1/\sqrt{2}(|1,1>-|2,0>)$ and $1/\sqrt{2}(|1,1>+|2,0>)$ respectively.

Referring to FIG. 17, a Bloch sphere 43 is shown.

To create a universal set of quantum gates, a system should be able to provide a single-qubit gate and a two-qubit gate. A single-qubit gate requires full access to the Bloch sphere 43 for one qubit. This is achieved by controlling the elevation Θ and the azimuth Φ. A two-qubit gate requires one two-qubit interaction, for example the "quantum XOR" or "cNOT" gate.

4.1 Charge Qubit

To establish a full one-qubit gate, the whole Bloch sphere should be accessible so that any superposition of states can be created. The elevation Θ is controlled by detuning $\epsilon$=e($V_{gl}$-$V_{gr}$) between the quantum dots $17_1$, $17_2$, i.e. the potential difference between the split gates $12_1$, $12_2$. The azimuth Φ can be controlled using high-frequency pulses applied to one of the gates $12_1$, $12_2$. The frequency, ω, of the pulse, the amplitude, $E_0$, and its duration $\tau_p$ set the value of Φ.

4.1.1 Single Qubit Control

A charge qubit single gate is performed as follows:

The qubit is initialised to the |1,1> state as hereinbefore described, which sets the qubit in the North pole of the Bloch sphere 43.

Detuning Gate: Θ Rotation

The angle Θ is controlled by the voltage difference $V_{gl}$-$V_{gr}$. For example, setting the voltage difference $V_{gl}$-$V_{gr}$=e/$C_g$ sets Θ=90°, i.e. the bonding state. Setting the voltage difference $V_{gl}$-$V_{gr}$=2e/$C_g$=$\epsilon_0$/2 sets Θ=180°, i.e. the |2,0> state. Any given angle Θ can be set using:

$$\Theta = \pi C_g (V_{gl} - V_{gr})/2e \quad (5)$$

Rabi Pulse Gate: Φ Rotation

The angle Φ can be controlled by means of microwave pulses using a microwave source 37 (FIG. 13).

Referring also to FIG. 8, the frequency of the microwave pulse ω should be such that the energy of the pulse, ℏω, matches the energy difference, ΔE, between the ground and excited state:

$$\hbar\omega = \sqrt{\left(\varepsilon - \frac{\varepsilon_0}{2}\right)^2 + 4t^2} \quad (6)$$

For example, in the case of detuning $\epsilon$=$\epsilon_0$: ω=2t/ℏ.

When the frequency of the microwave excitation matches the energy difference, i.e. when equation 6 above is satisfied, the system evolves in the x-y-plane at a fixed latitude Θ in the Bloch sphere 43 and the angle Φ is given by:

$$\Phi = \frac{\Omega_R \tau_P}{2} = \frac{\mu E_0 \tau_p}{2\hbar} \quad (7)$$

where, $\Omega_R$ is the Rabi frequency, μ is the electric dipole moment of the double quantum dot $17_1$, $17_2$, $E_0$ is the amplitude of the microwave pulse and $\tau_p$ the length of the pulse. The value of the dipole moment is given by μ=ew, where w is the width of the nanowire, i.e. the separation of the dots $17_1$, $17_2$. For typical values of operation, w=50 nm and $E_0$=$10^5$ V/m, a π rotation is achieved for a microwave pulse of length $\tau_p$~1 ps.

4.1.2 Two-Qubit Gate

To create a full gate set, a two-qubit gate can be implement in the form of a controlled NOT gate (cNOT).

A controlled NOT gate relies on the difference in the electric field surrounding the double quantum dot $17_1$, $17_2$ depending on whether the double quantum dot $17_1$, $17_2$ is in the bonding or anti-bonding state. In the bonding state, charge distribution is centred between the two dots $17_1$, $17_2$ constituting the double quantum dot $17_1$, $17_2$. In the antibonding state, two maxima of distribution are set at each end of the double quantum dot $17_1$, $17_2$. The strength of electric field perpendicular to a line running through the centre of the two dots $17_1$, $17_2$ varies according to the molecular state. It is stronger for the bonding state and is weaker for the anti-bonding state in the middle of the double quantum dot $17_1$, $17_2$.

Referring also to FIG. 18, a system $25_1$ for implementing a charge qubit controlled NOT gate is shown comprising two, two-qubit devices 1 each having first and second qubits $17_1$, $17_2$.

Referring also to FIG. 19, the electric field surrounding a given qubit also acts on its neighbours due to the capacitive coupling between neighbouring dots $17_1$, $17_2$ and detunes the neighbouring qubit's state along the ϵ-axis by a value Δϵ.

The controlled NOT gate can therefore be operated as follows:

Let the bonding state $(|1,1\rangle+|2,0\rangle)/\sqrt{2}$ be $|0\rangle$ and the anti-bonding state $(|1,1\rangle-|2,0\rangle)/\sqrt{2}=|1\rangle$. The two qubit states are defined as the product of a target qubit and a control qubit, e.g. $|1\rangle \otimes |1\rangle=|1,1\rangle$.

Initialise the control qubit to $|0\rangle$ and the target qubit to its start state $|0\rangle$ or $|1\rangle$ by setting the appropriate gate voltages and applying a microwave pulse, if necessary, as hereinbefore described.

Leaving the control qubit in $|0\rangle$ allows for successful rotation of the target qubit using a π-pulse.

Setting the control qubit to $|1\rangle$ by pulsing, as described in relation to a one-qubit gate, detunes the target qubit along the ϵ axis by an amount Δϵ. The same pulse as previously applied to the target now results in a probability smaller than 1 for the target qubit to be flipped. Moreover, the Rabi frequency is increased making the system evolve at a different rate leading to an unsuccessful rotation of the target qubit.

FIG. 20 shows the input-output table for the controlled NOT gate.

Induced detuning Δϵ is a parameter of the cNOT gate which sets the fidelity of this gate, i.e. rate of successful cNOT operation. The larger Δϵ, the higher the fidelity of the cNOT gate.

Figure 21:
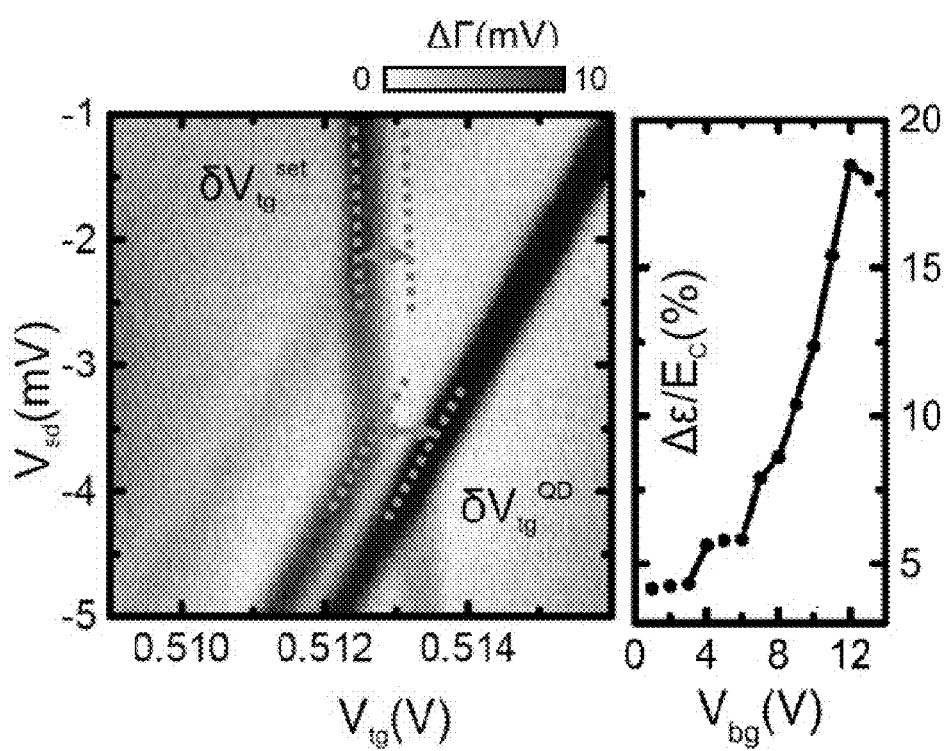
FIG. 21 shows (on the left panel) electrostatic interaction between two adjacent quantum dots wherein an electron loaded in one quantum dot induces a potential in the other quantum dot given by $\delta V^{qd}$ and which can seen as an induced detuning and (on the right panel), reduced induced detuning $\Delta \epsilon / E_C$ as a function of the back gate voltage.

FIG. 21 is a greyscale plot of top gate (reflectometry) response as a function of top gate voltage and source-drain voltage and back gate response for a device (not shown) which is similar to transistor 1, but which has a single top gate, i.e. does not have a split-gate configuration, and which is described in M. F. Gonzalez-Zalba, et al. ibid.

The device (not shown) demonstrates back gate control over the detuning Δϵ achieving almost 20% of the total charging energy $E_C$ of the quantum dot. For typical values of operation, w=50 nm and $E_0=10^5$ V/m, this sets the fidelity of the gate to about 75%. However, Δϵ can be engineered by setting the distance, s, between adjacent sets of double quantum dots. Typically, this lies in a range between 40 to 60 nm.

4.2 Singlet-Triplet Qubit
4.2.1 Single Qubit Control

The qubit is initialised to the $|1,1\rangle$ state as hereinbefore described.

Figure 22A:
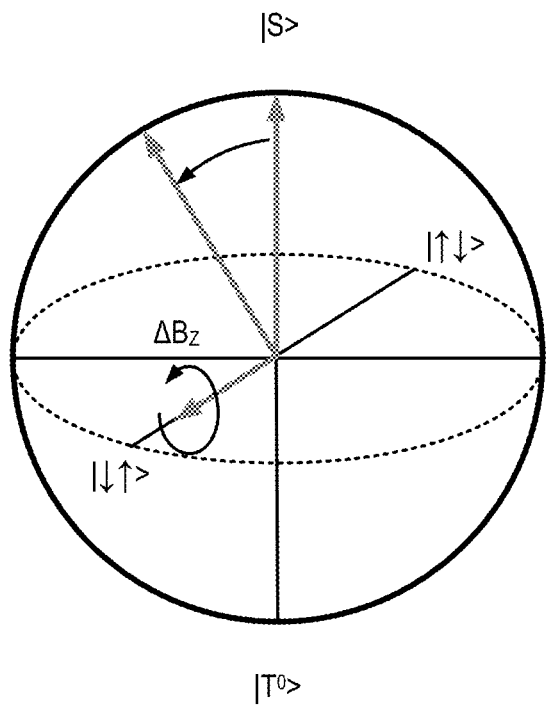
FIG. 22A and FIG. 22B show Bloch spheres illustrating singlet-triplet qubit control in by virtue of magnetic field difference ($\Delta B_Z$) rotation around the x axis defined by the |↑,↓>, |↓,↑> states and exchange rotations around the z-axis respectively.

Two different mechanisms can then drive spin rotations:
Magnetic Field Difference Gate ($\Delta B_Z$)—Θ Rotation Referring to FIG. 22A, the magnetic field gradient between the two quantum dots $17_1$, $17_2$ drives the Θ rotation (in this case rotations around the x-axis). The qubit evolves at this point between the S and T states with Θ given by:

$$\Theta = \frac{g\mu_B \Delta B_Z \tau_M}{\hbar} \quad (8)$$

where g is the electron g-factor, $\mu_B$ is the Bohr magneton and $\tau_M$ is the amount of time the gate is operated. The interaction is always on and cannot be electrically controlled during sequential operation. For typical operation parameters including $\Delta B_Z=1$ mT, a π-rotation can be performed in $\tau_M=70$ ns.

Exchange Gate (J)—Φ Rotation

Figure 22B:
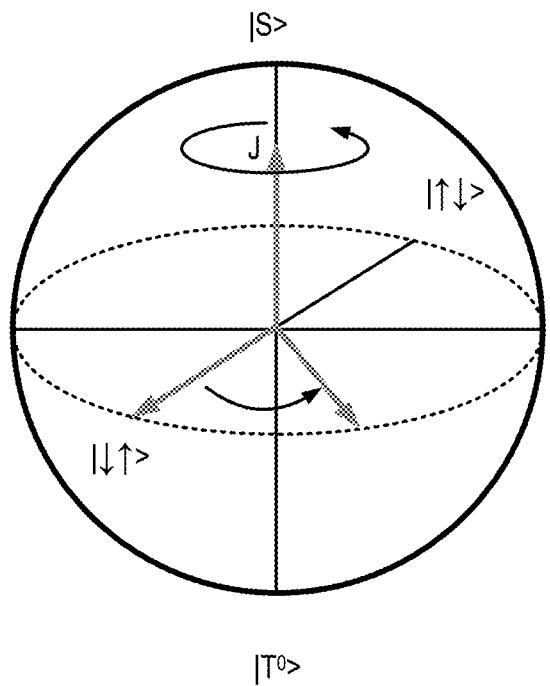
Figure 23A:
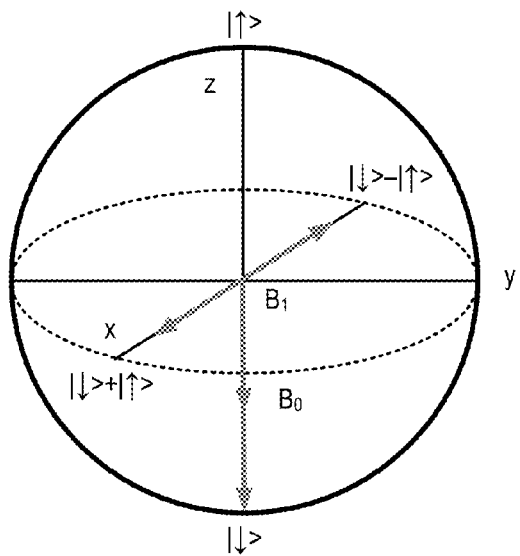
FIG. 23A shows a Bloch sphere of single spin qubit in which the |↓> and |↑> states reside respectively in the south and north pole, superposition states are represented at the hemisphere, the external magnetic field $B_0$ is represented in the –z direction and the oscillating $B_1$ in the x direction
Figure 23B:
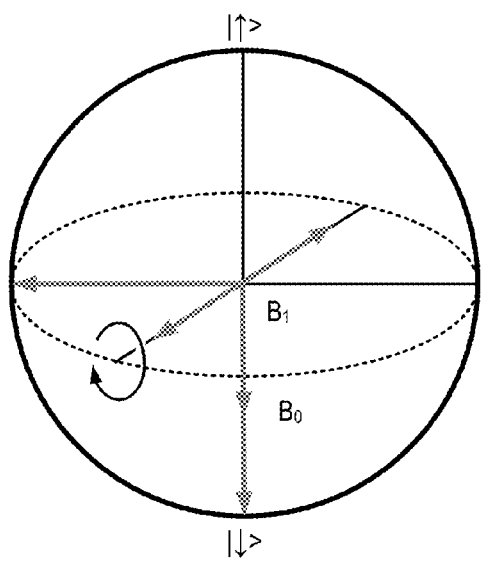
FIG. 23B shows a Bloch sphere of single spin qubit such that when the phase of $B_1$ is set to $\phi$=0, Y-rotations are produced.
Figure 23C:
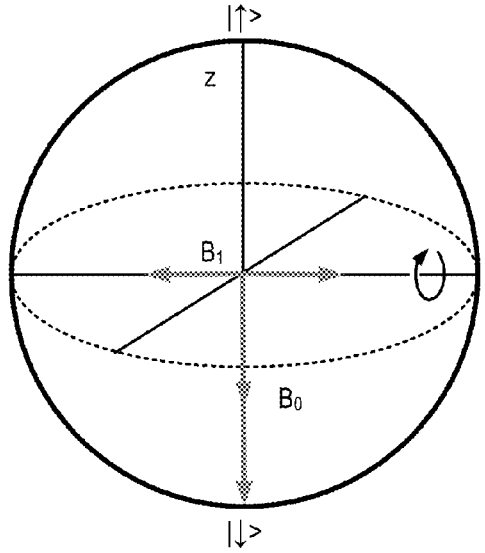
FIG. 23C shows a Bloch sphere of single spin qubit such that when the phase of $B_1$ is set to $\phi$=90, X rotations can be produced.

Referring to FIG. 22B, the exchange coupling J(ϵ) between the electron spins of two adjacent quantum dots $17_1$, $17_2$ drives qubit rotations around the z-axis. The Φ rotation is given by:

$$\Phi = \frac{J(\varepsilon)t_E}{\hbar} \quad (9)$$

Two different mechanisms can control the strength of this interaction.

As previously mentioned, the tunnel coupling between quantum dots $17_1$, $17_2$ can be controlled globally for all pairs of double quantum dots by using the back-gate voltage $V_{bg}$. Given that at $\epsilon=\epsilon_0/2$ the exchange coupling J=t, this provides a means to coarse-tune J.

The exchange coupling can be fine-tuned by means of the electric field detuning ϵ. At $\epsilon=0$, the exchange coupling is $J=4t^2/E_C$. For typical operation parameters where t=1 GHz and $E_C=15$ meV, this allows J to be tuned by three orders of magnitude, in the range 4 neV to 4 μeV.

For typical operation parameters J=1 μeV, a π-rotation can be performed in τ=4 ns.

J and $\Delta B_Z$ gates provide independent rotation axes, but only direct control of J is achievable. Thus, to achieve full Bloch sphere control, J values much larger than and much smaller than $g\mu_B\Delta B_Z$ should be achieved. This sets a preferred value for typical operation parameters of $\Delta B_Z=0.1$-10 mT.

4.2.2 Two-Qubit Gate

The singlet-triplet two-qubit gate uses the electrostatic coupling between adjacent sets of double quantum dots in a similar way to the charge two-qubit gate hereinbefore described. When J is non-zero, then the S and $T^0$ states have different charge configurations. This charge difference causes the S and $T^0$ states of one qubit to produce a different electric field on the neighbour qubit. As J depends on ϵ, the electric field detuning, the state of one qubit tunes the value of the exchange coupling on the other qubit and hence the precession frequency.

The change in electric field on one qubit imposed by the state of the second qubit is proportional to the dipole-dipole coupling of the two qubits $J_{12}$. As the dipole-dipole coupling is proportional to the product of exchange couplings in the first qubit and the second qubit, i.e. $J_{12} \propto J_1 J_2$, this offers a way to tune the S-T two qubit gate electrostatically by tuning $J_i$ as explained earlier.

4.3 Spin Qubit
4.3.1 Single Spin Qubit Control

The single spin qubit is controlled by electron spin resonance (ESR) techniques. ESR requires an external magnetic field $B_0$ that Zeeman-splits the single electron spin states by an energy $\Delta E=g\mu_B B_0$ and AC magnetic fields $B_1(t)=B_1 \cos(\omega t+\phi)$ that control spin rotations. The condition for resonant spin rotation is achieved when the frequency of the AC magnetic field matches the energy difference between the $|\downarrow\rangle$ and $|\uparrow\rangle$ spin states. This equation sets the frequency of the magnetic fields to be delivered. In the case of dilution fridge operation (T=100 mK) where $B_0^{min}$=0.1 T, this sets f=ω/2π=2.8 GHz and for 4K operation, f=85 GHz. The method for AC magnetic field delivery is explained hereinafter.

The effect of an oscillating magnetic field of the single spin is reflected in a new Hamiltonian of the system which, in the rotating reference frame of the field at resonance, becomes $$H = \frac{\hbar}{2}\begin{pmatrix} 0 & \Omega e^{-i\varphi} \\ \Omega^* e^{i\varphi} & 0 \end{pmatrix} \quad (10)$$

where $\Omega=\mu_B B_1/\hbar$ is the Rabi frequency of the system. The AC magnetic field effectively couples the two spin states $|\downarrow\rangle$ and $|\uparrow\rangle$ via the electron magnetic moment $\mu_B$.

As can be seen from equation 10 above, the AC magnetic field produces X and Y rotations that control the angle θ (i.e. non-zero, off-diagonal terms), but it does not directly produce Z rotations that control the angle Φ (i.e. zero diagonal terms). However, Z rotations can be accomplished by composite X, Y pulses.

Universal one spin qubit control can be achieved in the following way

The qubit is initialised to the $|\downarrow\rangle$ state as hereinbefore which sets the qubit in the south pole of the Bloch sphere.

Y (X) Gate—Θ Rotation

Y rotations are controlled by on-resonance ESR pulses. The axis of rotation can be controlled by tuning the phase of the AC magnetic field. Setting φ=0(90) produces X(Y) rotations. The duration of the pulse $t_y$ sets the Θ rotation as follows:

$$\theta = \frac{\mu_B B_1}{\hbar} t_y \quad (11)$$

This sets the operation frequency of the qubit to 28 GHz/T. For typical values of $B_1$ in ESR cavities and coplanar waveguides $B_1$~1 mT, setting the operation frequency to 28 MHz. The time required for a π-rotation is then $t_y$~110 ns. Larger $B_1$ can be set for faster qubit rotations.

Z Gate—Θ Rotation

The interacting Hamiltonian of equation 10 above does not allow for direct spin rotations along the Z-axis. However, composite sequences exist which comprise X and Y gates that perform dynamic Z rotations. For example, a rotation of angle Φ about the Z-axis can be performed with the sequence $(\pi/2)^X:(\Phi)^Y:(\pi/2)^{-X}$ where the superscript stands for the angle of rotation. The total duration of the composite pulse $t_c$ sets the angle of rotation Φ:

$$\Phi = \frac{\mu_B B_1}{\hbar} t_c - \pi \quad (12)$$

for $t_c > \pi/\mu_B B_1$. This requires $t_c$=220 ns for a Z π-pulse.

4.3.2 Two-Qubit Gate (Exchange Gate+One-Qubit Gates)

The two-qubit interaction used to implement a two-qubit gate is the exchange interaction between two electron spins in separated quantum dots $17_1$, $17_2$ as hereinbefore described and shown FIG. 9. For that purpose, two electrons, one in each dot, are loaded following the procedure explained in section 3.1 to state $|1,1\rangle$.

The exchange interaction can be switched on and off by means of gate voltage detuning. At zero detuning ε=0 (i.e. $V_{gl}=V_{gr}$), the electrons are spatially separated and the exchange interaction J→0 and at ε=ε$_0$/2, J=t, i.e. half the tunnel coupling between the two quantum dots $17_1$, $17_2$ of the qubit. The exchange gate rotates spins with respect to each other producing an accumulated phase between the two spins given by $$\Theta_j = \frac{J t_j}{\hbar} \quad (13)$$

where $t_j$ is the time the exchange gate is on. For typical value of J=20 μeV, a SWAP operation, a quantum operation in which the spin system acquires a π phase, can be achieved in approximately $t_j$=100 ps.

The exchange interaction is not universal. However, a universal quantum gate, cNOT gate, can be synthesised from an appropriate sequence of exchange interactions, in conjunction with particular one body interactions. Thus, a cNOT gate can be achieved from single qubit rotations at detuning ε=0 and two-qubit exchange at ε=ε$_0$/2.

4.3.3 AC Magnetic Field Delivery

AC magnetic fields for manipulating spins can be delivered in two ways:

4.3.3.1 Global AC Magnetic Fields with Individual Addressability

Global AC magnetic fields can be delivered by placing the chip on a microwave resonator (not shown), for example an X-band resonator operating at 9.6 GHz and 0.35 T or a Q-band resonator at 35 GHz and 1.24 T. The values of $B_1$ commonly achieved in microwave resonators are homogenous within 5 mm which sets the maximum chip size.

The AC magnetic field is delivered globally for all qubits. To address single spins individually, a Stark shift effect can be used to control the ESR condition for each individual spin.

The local electric field produced by each independent gate creates a Stark shift of the electron g-factor due to the small, but finite, spin-orbit coupling in silicon according to:

$$\frac{g(F)}{g(0)} - 1 = \eta_2 |F|^2 \quad (14)$$

where F is the electric field magnitude and $\eta_2$ is the Stark coefficient. For typical values in silicon, where $\eta_2$=2.2 nm$^2$V$^{-2}$, an electric field change of 1 MV/m produces an ESR frequency resonance shift of 4 MHz which is larger than the broader ESR linewidths in silicon (for typical coherence times in silicon $T_2^*$>360 ns the ESR linewidths are less than 2.5 MHz) allowing to address individual spins. The electric field of 1 MV/m can be produced by approximately a 1 mV gate voltage shift when an equivalent oxide thickness of 1 nm is used.

4.3.3.2 Local AC Magnetic Fields

Figure 24:
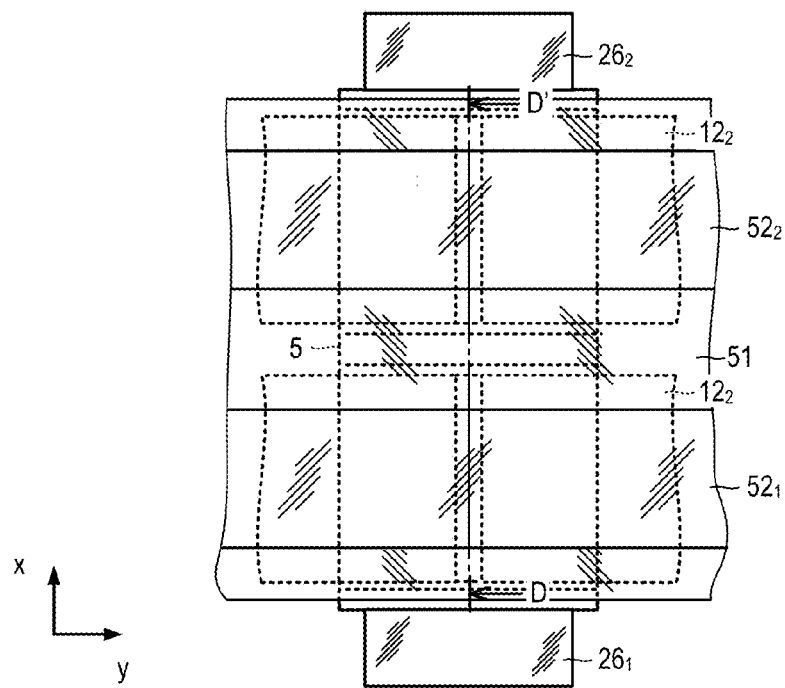
FIG. 24 is a plan view of a system comprising two transistors, each transistor having a bus line running over the spit gate for delivering an AC magnetic field.
Figure 25:
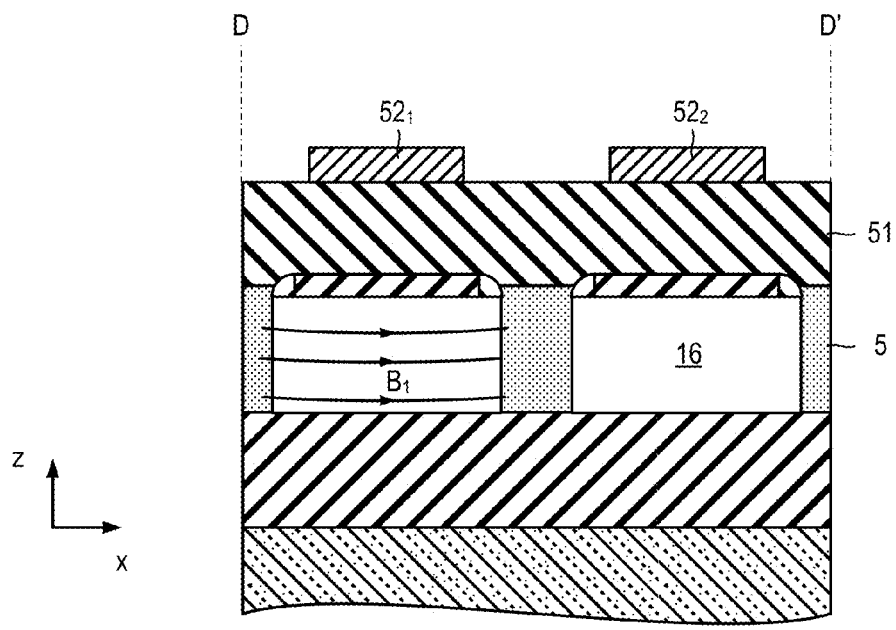
FIG. 25 is a cross-sectional view of the device shown in FIG. 24 taken along the line D-D'.

Referring to FIG. 24 and FIG. 25, a system $25_2$ for implementing a spin qubit gate is shown comprising transistors 1. The system $25_2$ includes a global dielectric layer 51 overlying the mesa 5 and top gates $12_1$, $12_2$ and respective metallic bus lines $52_1$, $52_2$, for example comprising copper or aluminium, disposed on the dielectric layer 50, for example, a layer of silicon dioxide having a thickness of 10 to 20 nm or more.

A bus line $52_1$, $52_2$ produces an AC Oersted magnetic field $B_1$ when an AC electric current, I, flows through the line $52_1$, $52_2$:

$$B_1 = \frac{\mu I}{2\pi r} \quad (15)$$

where $\mu$ is the magnetic permeability of the material in the dielectric layer 50. For a typical distance between bus line $52_1$, $52_2$ and intrinsic channel 15 of r=100 nm and an AC electric current of 500 µA, then a field $B_1$=1 mT can be generated.

Typical thickness of the bus line $52_1$, $52_2$ will depend on the material, but in case of copper operated at 30 GHz, a thickness of 400 nm is preferred. This can help to minimise heating effects due to Joule currents. Larger thicknesses tend not to provide much improvement due to the skin effect.

50Ω-matched shorted coplanar waveguides can be used to maximise locally the strength of the $B_1$ and minimise the effect of local electric fields that could detune the device.

5 Qubit Specific Readout

Figures 26D, 26E:
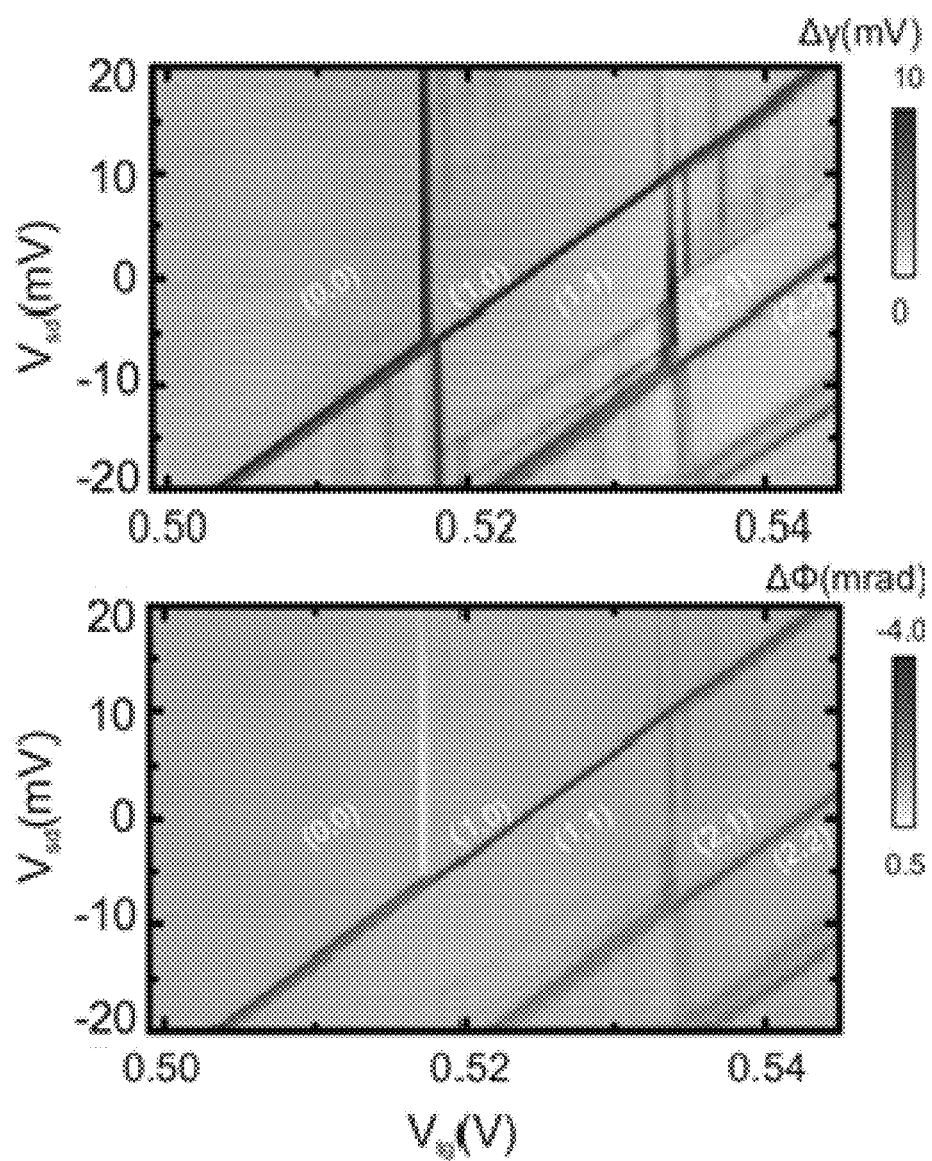
FIG. 26D and FIG. 26E show gate sensor magnitude response and phase response for the device shown in FIG. 26B.

Readout is performed via a gate-based, radio-frequency charge sensing as described in M. F. Gonzalez-Zalba, et al. ibid. FIG. 26A shows the device described in M. F. Gonzalez-Zalba, et al. ibid. FIG. 26B shows the device embedded in a resonant tank circuit, where $C_p$ is the parasitic capacitance to ground and L is a surface mount inductor. FIG. 26C shows reflectometry responses in magnitude (top) and phase (bottom) when the device is OFF ($V_{tg}$=0 V) and ON ($V_{tg}$=1 V). FIG. 26D and FIG. 26E show gate sensor magnitude response phase response for the device.

Referring to FIG. 1, a similar arrangement is used to readout the transistor 1 (FIG. 1). One of the split gates $12_1$, $12_2$ is connected to a resonant circuit which is driven at its resonant frequency $f_0$. The reflected signal is amplified and quadrature demodulated. The magnitude and phase of the reflected signal are functions of the impedance of the double quantum dot. At the resonant frequency $f_0=1/(2\pi)(LC)^{-0.5}$, where C is the resonant circuit's total capacitance and L is an inductor, for example, a surface-mount or on-chip inductor, surface acoustic wave resonator or even co-axial cable, the magnitude ($\gamma$) and phase ($\phi$) components of the reflected signal are sensitive to admittance changes of the device. Changes in the power dissipation in the system are captured in $\gamma$, whereas $\phi$ reflects susceptance changes, such as tunnelling or quantum capacitance. Thus, the detector is sensitive to additional power that is dissipated when a charge is cyclically driven through a degeneracy point by an RF excitation with frequency $f_0$ comparable to the tunnel rate. Moreover, a dispersive signal may be detected when electrons on average tunnel out-of-phase with rf cycle, generating an additional tunnelling capacitance contribution $C_t=\alpha\, d<ne>/dV_{tg}$ where $<ne>$ is the average charge in the island. Such an rf gate sensor provides experimentally verified charge sensitivities as low as 37 µe/√Hz at 8 MHz bandwidth. This is an improvement of two orders of magnitude over previous attempts at using rf gate readout to detect double quantum dots $17_1$, $17_2$. In addition, sensitivity to phase changes of the order of 1 mrad have been confirmed experimentally, which allows for the detection of aF capacitance changes. Theoretical calculations predict that values as low as 70 ne/√Hz for the charge and 0.04 µrad/√Hz for the phase sensitivity can be reached.

5.1 Charge Qubit Readout

Figure 27:
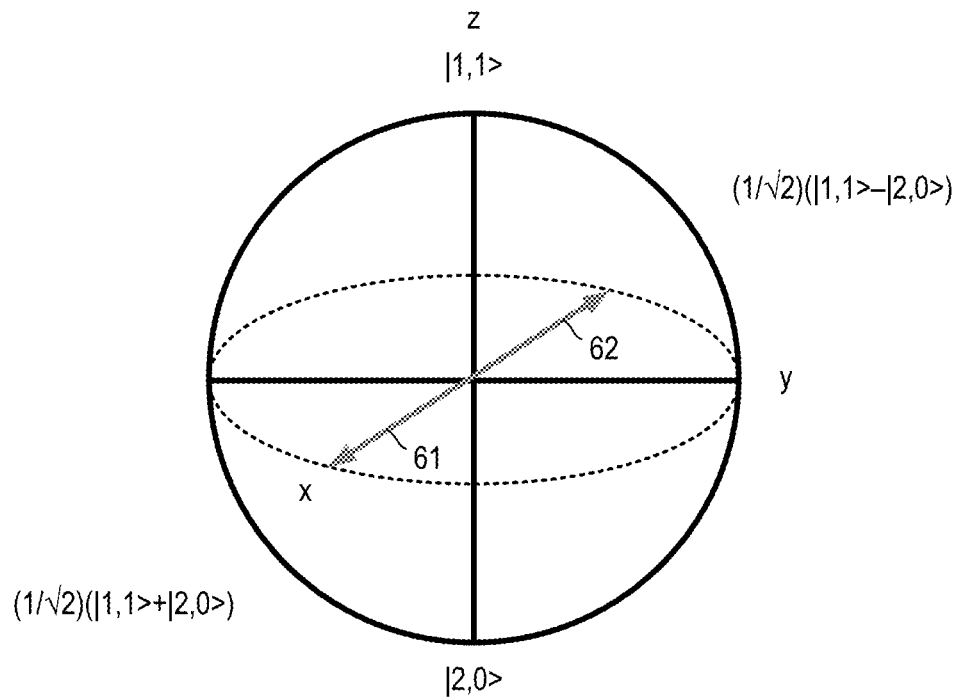
FIG. 27 shows a Bloch sphere and bonding and antibonding states that are measured using gate-based readout.
Figure 28:
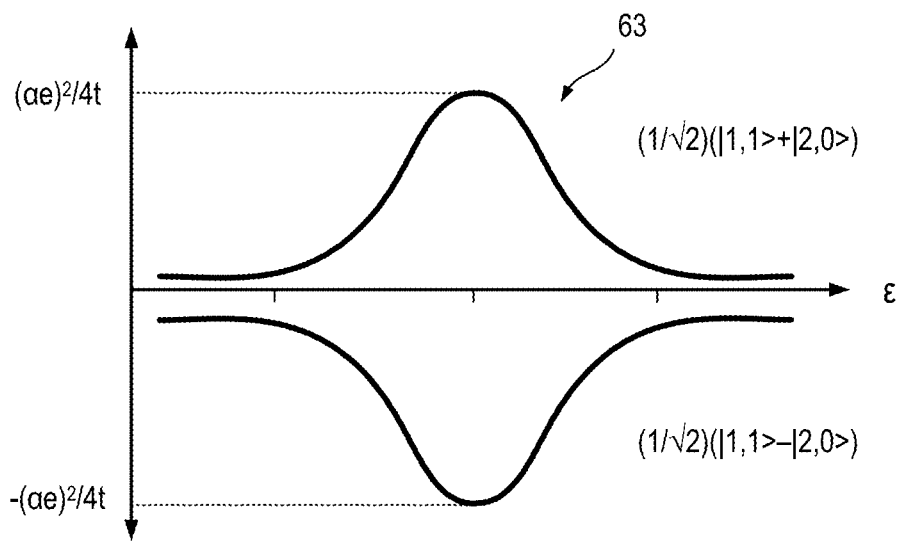
FIG. 28 shows plots of quantum capacitance of the bonding and antibonding states as a function of detuning for charge qubit state readout.

Referring to FIG. 27 and FIG. 28, readout of a charge qubit state can be performed dispersively, i.e. without the need to collapse the qubit's wavefunction. This relies on the difference in quantum capacitance contribution $C_Q$ of the bonding state 61 and anti-bonding state 62 to the overall capacitance. $C_Q$ is given by the curvature of the energy bands 63:

$$C_Q^\pm = -(\alpha e)^2 \frac{\partial^2 E_\pm}{\partial \varepsilon^2} \quad (16)$$

where $\alpha$ is the ratio between the gate capacitance and the total capacitance of the quantum dot being measured.

After computation, the qubit is detuned to a value close to $\varepsilon_0/2$. Here, the capacitance of the system is different for different quantum states. The additional quantum capacitance loads the resonator producing a phase shift of the reflected signal that can be readily measured. Thus, this provides information whether the qubit is in the bonding |0> state or anti-bonding |1> state.

$$C_Q^\pm(\varepsilon = \varepsilon_0/2) = \mp \frac{1}{2}\frac{(\alpha e)^2}{2t} \quad (17)$$

For typical operation values $\alpha$=0.95 and t=1 to 20 GHz, the expected quantum capacitance difference is 1 to 20 fF which is readily detectable by the gate-based sensor.

5.2 Singlet-Triplet Qubit Readout

In the case of the singlet-triplet qubit, readout is slightly different.

Figure 29:
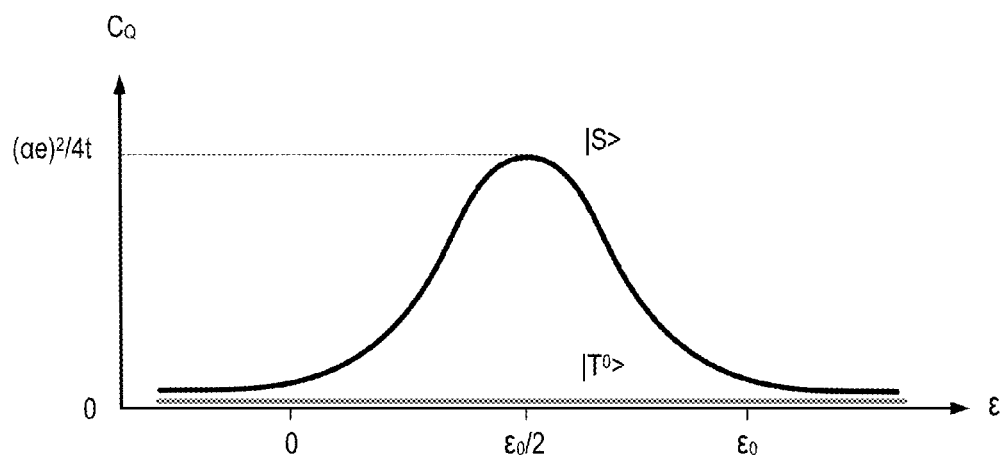
FIG. 29 shows plots of quantum capacitance for singlet and triplet states for singlet-triplet qubit state readout.

Referring to FIG. 29, at $\varepsilon=\varepsilon_0/2$, the quantum capacitance $C_Q$ of the ground singlet state is at a maximum whereas it remains zero for the triplet state, thereby allowing the two different spin configurations to be distinguished. In this case, the expected quantum capacitance change is 0.5 to 10 fF.

5.3 Single Spin Qubit Readout

5.3.1 Projective Measurement.

In the case of the spin qubit, the readout mechanism is the same as the singlet-triplet qubit readout. However, this readout technique the state of one spin qubit is read conditionally to the state of a different qubit. This mechanism involves the following steps:

The system is brought from the (1,0) state (at which ($V_{gl}$, $V_{gr}-e/C_g$)) to the (1,1) configuration (at which $V_{gl}=V_{gr}\sim0.51V$). In this case, $\varepsilon=0$. The spin orientation of the right spin is set to |↓> by means of manipulation techniques described in section 4.3.1 above. If the state of the left spin is |↓>, then the system is in triplet configuration which has no quantum capacitance contribution as hereinbefore described. If the left spin is |↑>, then the system is spin singlet state. A voltage shift to $\varepsilon=\varepsilon_0/2$ gives a quantum capacitance contribution of about 0.5 to 10 fF.

The difference in quantum capacitance between the two eigenstates of the qubit is about 0.5 to 10 fF and is readily detectable by the gate-based sensor.

5.3.1 Spin Dependent Tunnelling: Tunnelling Capacitance and Sisyphus Dissipation.

A second way to readout the state of a single spin involves spin-dependent tunnelling from a quantum dot to an electron reservoir, i.e. source or drain. This mechanism allows for individual spin readout. However, the gate voltage tolerance of this option is small. The measurement protocol is as follow:

The system is initially in the (1,0) state. A magnetic field is applied which is larger than the thermal energy, i.e. $B > k_B T$.

Figure 30:
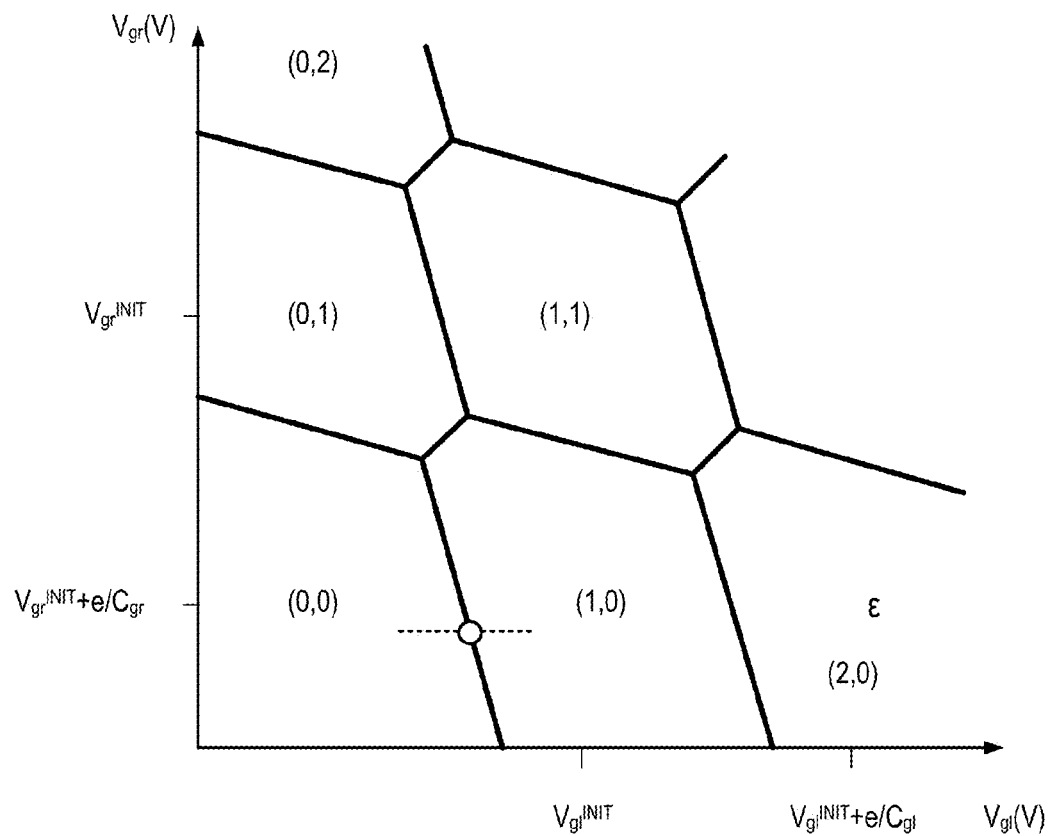
FIG. 30 shows a voltage stability diagram indicating stable electron configurations of a double quantum dot system and illustrate spin qubit readout between (0,0)-(1,0)

Referring to FIG. 30, $V_{gl}$ is detuned to the (0,0)-(1,0) transition. The voltage tolerance $\Delta V_{gl}$ is set by $g\mu_B B/\alpha 2$. Thus, for an applied magnetic field $B = 1$ T, $\Delta V_{gl} = 50$ µV.

Figure 31:
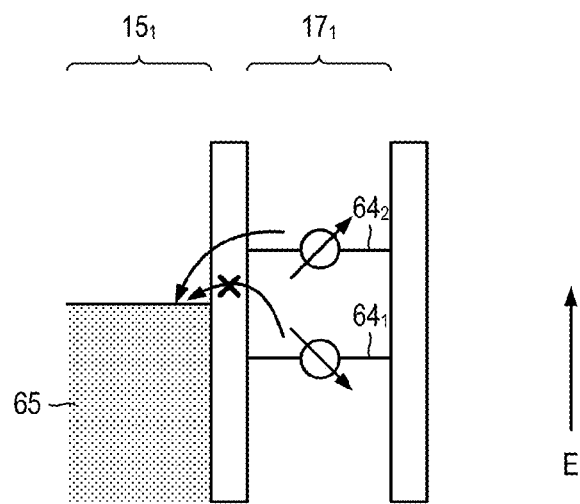
FIG. 31 schematically illustrates an electron reservoir and a quantum dot having two Zeeman-split states.

Referring to FIG. 31, one of the Zeeman split-levels $64_1$ lies below the top of the electron reservoir 65 and the other level $64_2$ lies above the top of the electron reservoir 65. The spin down branch $64_2$ cannot tunnel to the electron reservoir 65, whereas the spin up branch $64_1$ is allowed to tunnel.

In the case of electron tunnelling, $|\uparrow\rangle$ state, there is an additional tunnelling capacitance contribution and Sisyphus dissipation that can be detected by the gate-based sensor. In the case of $|\downarrow\rangle$ state, there is neither tunnelling capacitance nor Sisyphus dissipation.

The difference in tunnelling capacitance and Sisyphus dissipation between the two eigenstates of the qubit is readily detectable by the gate-based sensor.

6 Scalability 6.1. Scalable Qubits

Referring again to FIG. 6, a scalable, multi-qubit system 25 can be implemented using a single silicon-on-insulator nanowire 5. The nanowire 5 has n devices, each comprising a pair of gates $12_1$, $12_2$ in a split-gate configuration. Each pair of gates $12_1$, $12_2$ can be used to form and control a double quantum dot $17_1$, $17_2$ (FIG. 3) and, thus, provide a single qubit.

The system 25 can be provided with a global gate 22 (FIG. 5) that controls whether the qubits are connected to electron reservoirs $26_1$, $26_2$.

The qubits along the nanowire are coupled. As explained earlier, coupling between adjacent sets of double quantum dots $17_1$, $17_2$ can be controlled, namely by adjusting the interdot separation, s, and/or by globally tuning the backgate potential. This allows the coupling, $\Delta\epsilon$, to be controlled simultaneously for all sets of double quantum dots $17_1$, $17_2$.

6.2 Scalable Readout

Reflectometry can be used to read out one of the quantum dots $17_1$, $17_2$ in each double quantum dot $17_1$, $17_2$. By connecting a respective tank circuit to one of the gates $12_1$, $12_2$ in each spit gate $12_1$, $12_2$, it is possible to readout each qubit's quantum state.

Frequency multiplexing can be used to reduce the complexity of the reflectometry circuitry. Normally, a cryogenic amplifier (not shown) is used to amplify the signal of a single qubit. This, however, is costly and difficult to implement since one amplifier is used per qubit. However, using a broadband amplifier, the circuitry can be improved by frequency-multiplexing radio-frequency reflectometry.

Figure 32:
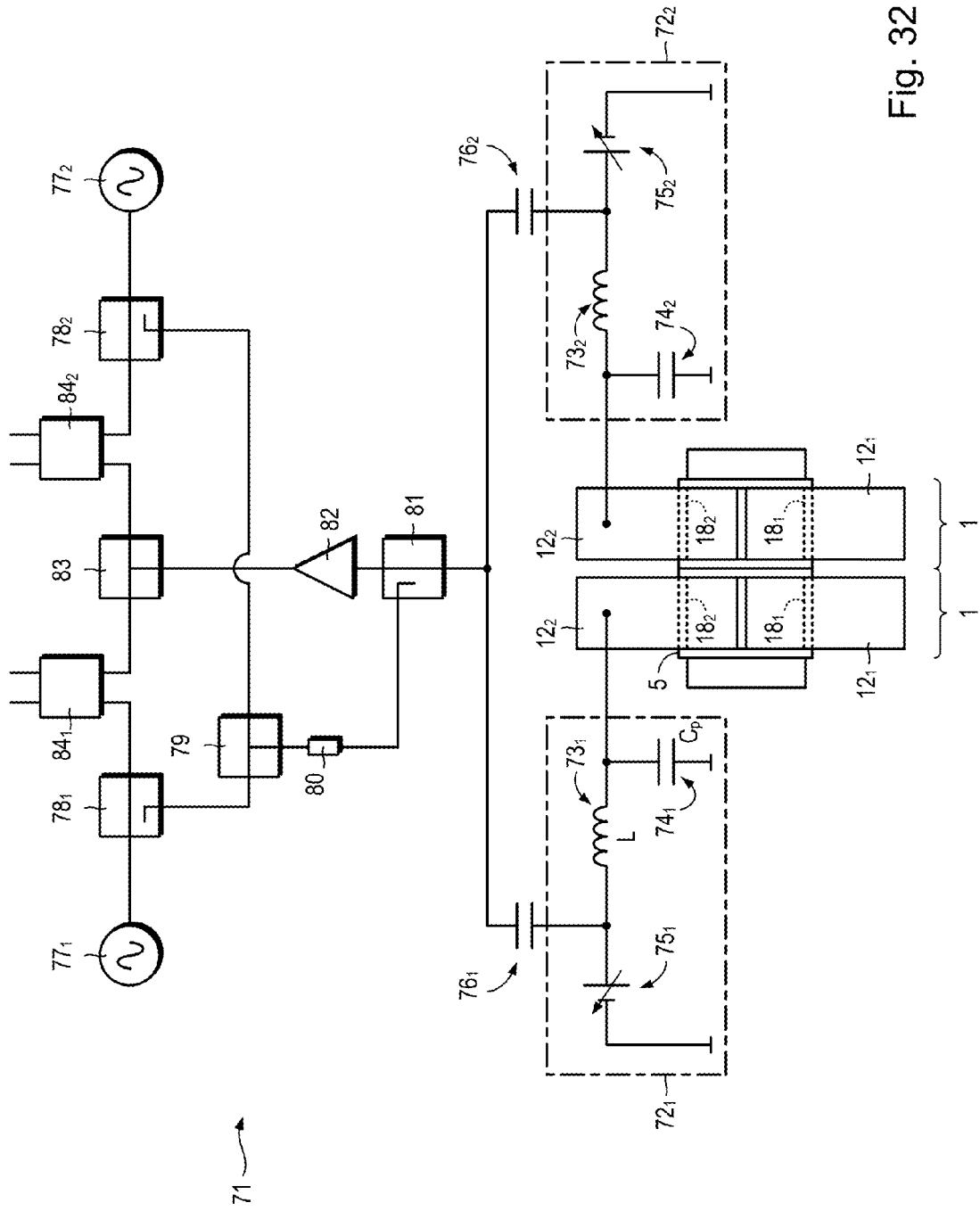
FIG. 32 illustrates a frequency multiplexer radio-frequency reflectometry circuit for two-qubit readout.

Referring to FIG. 32, frequency-multiplexing radio-frequency reflectometry circuitry 71 is shown. The circuitry 71 is arranged for measuring two qubits. However, the circuitry can be adapted for measuring more than two qubits.

The circuitry 71 comprises first and second resonant tank circuits $72_1$, $72_2$. Each resonant tank circuit $72_1$, $72_2$ comprises an inductor $73_1$, $73_2$ and parasitic capacitances $74_1$, $74_2$ to ground. One end of the inductor $73_1$, $73_2$ is coupled to a gate $12_2$ and to the parasitic capacitance $74_1$, $74_2$, the other end is coupled to a voltage source $75_1$, $75_2$ and to a coupling capacitor $76_1$, $76_2$. The inductors $73_1$, $73_2$ have different values. Preferably, the inductors $73_1$, $73_2$ are around 400 nH.

To monitor the charge sensors, the circuit 71 includes first and second signal generators $77_1$, $77_2$ which feed respective signals at different carrier frequencies via respective directional couplers 78 to a single coaxial line (not shown) driving both resonant circuits by means of a combiner 79 via an attenuator 80 and a directional coupler 81.

The reflected signals are amplified by an amplifier 82, split into two paths by splitter 83 and fed into phase detectors in the form of quadrature demodulators $84_1$, $84_2$.

This arrangement can be extended to accommodate a larger number of resonant tank circuits, taking into account amplifier bandwidth $B_A$ and the bandwidth of each individual resonator $B_r$, which allow readout of $n = B_A/B_r$ qubits.

Thus, to measure n qubits, then n carrier frequencies are combined and an n-way splitter is used to split the received signal and feed them into n-phase detectors.

6.2 Two- and Three-Dimensional Arrays of Devices

Referring again to FIG. 6, a one-dimensional array of n-devices 1 can share a common mesa 5 arranged between contact regions $26_1$, $26_2$. One or more devices 1 provided on one or more mesas 5 can be coupled together to form a two- or three-dimensional array of device and/or construct more complex arrangements of qubits.

Figure 33:
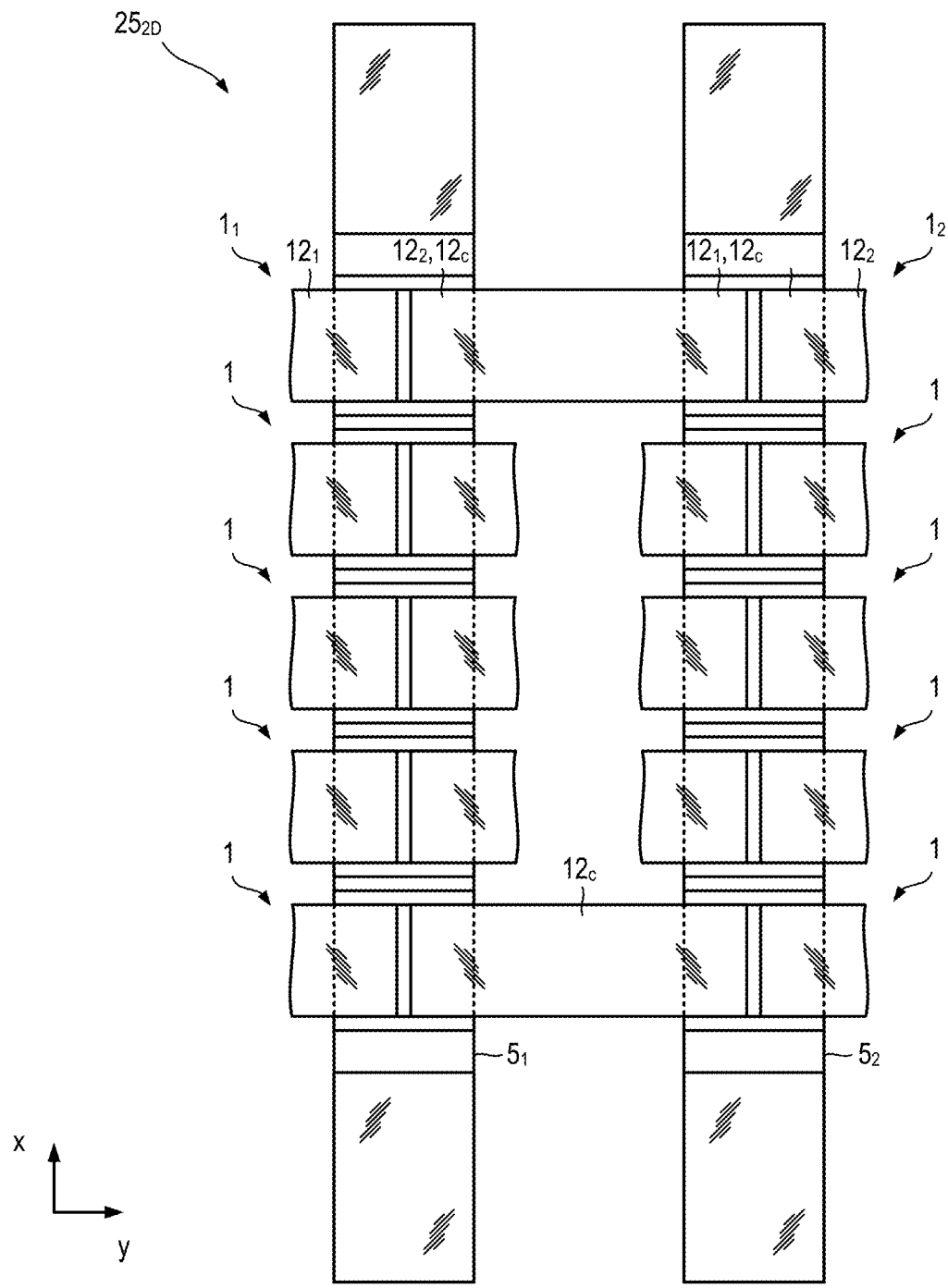
FIG. 33 is a plan view of a multiple, two-qubit system comprising a two-dimensional array of silicon nanowire field-effect transistors.

Referring to FIG. 33, a two-dimensional array of devices 1 is shown comprising a one-dimensional array of two mesas $5_1$, $5_2$. A shared gate 12C, providing half of the split gate $12_1$, $12_2$ of a first device $1_1$ provided by a first mesa $5_1$ and one half of the split gate $12_1$, $12_2$ of second device $1_2$ provided by a separate mesa $5_2$ can be used to couple adjacent devices $1_1$, $1_2$. One, two or more pairs of devices 1 can be coupled. Although only two mesas $5_1$, $5$ are shown, a greater number of mesas can be used.

Vertical stacks mesas can be configured to form a two-dimensional array of mesas and so implement a three-dimensional array of devices 1. A shared gate can be run vertically through a via (not shown).

Although FIG. 33 shows adjacent devices sharing gates, they need not be adjacent. Thus, complex interconnections may be formed.

It will be appreciated that many modifications may be made to the embodiments hereinbefore described.

The device may be arranged to form quantum dots in lower edges of a nanowire. Thus, a split gate may be formed on the substrate and may be covered by a gate dielectric and a nanowire may overlie the gate dielectric.

The device may be arranged to form quantum dots in lateral or diagonally opposite edges of a nanowire. Thus, a first gate may be formed on the substrate and may be covered by a first gate dielectric, a nanowire may overlie the gate dielectric, a second gate dielectric may be formed over the nanowire and a second gate may be formed on the second gate dielectric.

The first and second quantum dots may be formed by first and second impurity atoms or molecules, such as donors or acceptor atoms or molecules.

The detector need not be a demodulator, but can be, for example, a gain-phase circuit.

The invention claimed is:

1. A quantum information processing apparatus comprising:
   a device for defining a qubit, the device comprising:
   a semiconductor nanowire extending along a first direction having first and second obtuse or acute edges running along the first direction;
   gate dielectric underlying or overlying the first and second edges of the nanowire; and a split gate running across the nanowire in a second, transverse direction, the split gate comprising first and second gates underlying or overlying the first and second edges respectively;
a reflectometry circuit for reading out the state of the qubit, the circuit comprising:
a resonator coupled to the first or second gate.

2. The apparatus according to claim 1, wherein the device further comprises:
first and second spacers spaced apart along the nanowire so as to constrain lengths of the edges.

3. The apparatus according to claim 1, wherein the device comprises:
at least two split gates spaced along the nanowire along the first direction.

4. The apparatus according to claim 1, wherein the device further comprises:
a conductive substrate; and
a dielectric layer disposed on the conductive substrate, wherein the semiconductor nanowire is supported on the dielectric layer.

5. The apparatus according to claim 1, wherein the device further comprises:
a dielectric layer overlying the semiconductor nanowire and split gate; and
a conductive layer overlying the dielectric layer.

6. The apparatus according to claim 1, wherein the device further comprises:
a ferromagnet disposed closer to the first or second edge so as to generate a magnetic field gradient between the first and second edges.

7. The apparatus according to claim 1, wherein the device further comprises:
a dielectric layer overlying the split gate; and
a conductive bus line running along the second direction over the split gate.

8. The apparatus according to claim 1, wherein the resonator comprises:
an LC circuit comprising an inductor having first and second terminals, the first terminal of the inductor coupled to the first or second gate.

9. The apparatus according to claim 1, wherein the reflectometry circuit further comprises:
a radio frequency signal source arranged to provide an excitation signal to the resonator; and
a phase detector arranged to measure phase change in the resonator.

10. The apparatus according to claim 1, wherein:
the device comprises:
first and second split gates spaced along the nanowire along the first direction;
the reflectometry circuit comprises:
first and second radio frequency signal sources;
a combiner for combining feed signals from the first and second radio frequency signal sources;
first and second phase detectors;
a splitter for splitting a reflected signal and feeding the signal to the first and second phase detectors;
first and second resonators, each resonator coupled to a one of the first and second gates of a one of the two split gates respectively; and
a coupler for allowing feed signals to be supplied to the first and second LC circuits and to receive reflected signals from the first and second LC circuits.

11. The apparatus according to claim 1, comprising:
first and second devices comprising first and second different nanowires; and
a common gate shared by the first and second devices, the common gate providing the first gate of the split gate of the first device and the second gate of the split gate of the second device.

12. The apparatus according to claim 11, wherein the first and second nanowires are laterally spaced apart.

13. The apparatus according to claim 11, wherein the first and second nanowires are vertically spaced apart.

14. A method of operating the apparatus according to claim 1, the method comprising:
forming first and second quantum dots in the device so as to form a qubit;
initialising the qubit in an initial state;
performing at least one transformation on the initial state which results in a final state; and
reading out the final state using the reflectometry circuit.

15. The method according to claim 14, wherein reading out the final state comprises:
detuning the qubit to a minimum or maximum in energy band and then reading the final state.

* * * * *